United States Patent
Johansson

(10) Patent No.: US 9,628,097 B2
(45) Date of Patent: Apr. 18, 2017

(54) METHODS AND DEVICES FOR HANDLING CHANNEL MISMATCHES OF AN I/Q DOWN-CONVERTED SIGNAL AND A TWO-CHANNEL TI-ADC

(71) Applicant: Signal Processing Devices Sweden AB, Linköping (SE)

(72) Inventor: Håkan Johansson, Linköping (SE)

(73) Assignee: Signal Processing Devices Sweden AB (SE)

( * ) Notice: Subject to any disclaimer, the term of this patent is extended or adjusted under 35 U.S.C. 154(b) by 0 days.

(21) Appl. No.: 14/652,634

(22) PCT Filed: Dec. 18, 2012

(86) PCT No.: PCT/EP2012/075901
§ 371 (c)(1),
(2) Date: Jun. 16, 2015

(87) PCT Pub. No.: WO2014/094823
PCT Pub. Date: Jun. 26, 2014

(65) Prior Publication Data
US 2015/0333950 A1  Nov. 19, 2015

(51) Int. Cl.
*H04L 1/00* (2006.01)
*H03M 1/06* (2006.01)
(Continued)

(52) U.S. Cl.
CPC ....... *H03M 1/0626* (2013.01); *H03M 1/1215* (2013.01); *H04L 1/0071* (2013.01); *H04L 27/364* (2013.01); *H04L 27/3863* (2013.01)

(58) Field of Classification Search
CPC .. H04L 27/2863; H04L 27/364; H04L 1/0071
(Continued)

(56) References Cited

U.S. PATENT DOCUMENTS

2004/0036638 A1* 2/2004 Lipka ................. H03M 7/3015
341/143
2006/0232460 A1  10/2006 Huang et al.
(Continued)

FOREIGN PATENT DOCUMENTS

| JP | 2004072532 A | 3/2004 |
| JP | 2011041049 A | 2/2011 |
| WO | 2008156400 A1 | 12/2008 |

OTHER PUBLICATIONS

Khoini-Poorfard, "Time-Interleaved Oversampling A/D Converters: Theory and Practice". IEEE Transactions on Circuits and Systems—II. Analog and Digital Signal Processing, vol. 44, No. 8. Aug. 1997.*
(Continued)

*Primary Examiner* — Kevin M Burd
(74) *Attorney, Agent, or Firm* — Lerner, David, Littenberg, Krumholz & Mentlik, LLP

(57) ABSTRACT

A method and device for handling an in-phase and quadrature ("I/Q") channel mismatch of an I/Q down-converted signal, and a use of the device. A discrete-time complex valued signal r(n) based on an analog-to-digital conversion of the I/Q down-converted signal is obtained. The obtained discrete-time complex valued signal r(n) is oversampled by a factor of two or more. An intermediate signal v(n) is formed from the discrete-time complex valued signal r(n). The intermediate signal v(n) corresponds to the real part of a π/2 frequency shifted version of the obtained discrete-time complex valued signal r(n). A procedure for obtaining an estimate of a frequency dependent mismatch of a two-channel time-interleaved analog-to-digital converter ("TI-ADC") is applied on the formed intermediate signal v(n). Thereby a TI-ADC mismatch estimate is obtained. The I/Q
(Continued)

channel mismatch is estimated and/or compensated based on the obtained TI-ADC mismatch estimate.

26 Claims, 10 Drawing Sheets

(51) Int. Cl.
H04L 27/36 (2006.01)
H04L 27/38 (2006.01)
H03M 1/12 (2006.01)

(58) Field of Classification Search
USPC .......................................... 375/349, 316, 346
See application file for complete search history.

(56) References Cited

U.S. PATENT DOCUMENTS

2011/0090107 A1* 4/2011 Mujica .................. H03M 1/004
341/155
2011/0140946 A1 6/2011 Sheppard

OTHER PUBLICATIONS

Guanbin Xing et al: 11 Frequency Offset and 1-28 I/Q Imbalance Compensation for Direct-Conversion Receivers, IEEE Transactions on Wireless Communications, IEEE Service Center, Piscataway, NJ, US, vol. 4, No. 2, Mar. 1, 2005 (Mar. 1, 2005), pp. 673-680, XP011129220.

International Search Report for Application No. PCT/EP2012/075901 dated Apr. 3, 2013.

International Written Opinion for Application No. PCT/EP2012/075901 dated Apr. 3, 2013.

L. Yu and W. Snelgrove, "A novel adaptive mismatch cancellation system for quadrature IF radio receivers," IEEE Trans. Circuits Syst. II: Analog and Digital Signal Processing, vol. 46, No. 6, pp. 789-801, Jun. 1999.

K. Pun, J. Franca, C. Azeredo-Leme, C. Chan, and C. Choy, "Correction of frequency-dependent I/Q mismatches in quadrature receivers," Electronics Lett., val. 37, No. 23, pp. 1415-1417, Nov. 2001.

G. Xing, M. Shen, and H. Liu, "Frequency offset and I/Q imbalance compensation for direct-conversion receivers," IEEE Trans. Wireless Comm., val. 4, No. 2, pp. 673-680, Mar. 2005.

B. Kirei, M. Neag, and M. Tapa, "Blind frequency-selective I/Q mismatch compensation using subband processing," IEEE Trans. Circuits Syst. II: Express Briefs, val. 59, No. 5, pp. 302-306, May 2012.

Anttila, M. Valkama, and M. Renfors, "Circularity-based I/Q imbalance compensation in wideband direct-conversion receivers," IEEE Trans. Vehicular Technology, vol. 57, No. 4, pp. 2099-2113, Jul. 2008.

H. Johansson and P. Lowenberg, "A least-squares filter design technique for the compensation of frequency-response mismatch errors in time interleaved AID converters," IEEE Trans. Circuits Syst. II: Express Briefs, vaL 55, No. 11, pp. 1154-1158, 2008.

H. Johansson, "A polynomial-based time-varying filter structure for the compensation of frequency-response mismatch errors in time-interleaved ADCs: Special issue on DSP techniques for RF/analog circuit impairments," IEEE J. Selected Topics Signal Processing, vol. 3, No. 3, pp. 384-396, Jun. 2009.

Y. C. Lim, Y. X. Zou, J. W. Lee, and S. C. Chan, "Time-interleaved analog-todigital converter compensation using multichannel filters" IEEE Trans. Circuits Syst. 1: Regular Papers, vol. 56, No. 10, pp. 2234-2247, Oct. 2009.

C. Vogel and S. Mendel, "A flexible and scalable structure to compensate frequency response mismatches in time-interleaved ADCs," IEEE Trans. Circuits Syst. I: Regular papers, vol. 56, No. 11, pp. 2463-2475, Nov. 2009.

T. Tsai, P. J. Hurst, and S. H. Lewis, "Bandwidth mismatch and its correction in time-interleaved analog-to-digital converters," IEEE Trans. Circuits Syst. II, vol. 53, No. 10, pp. 1133-1137, Oct. 2006.

M. Seo, M. J. W. Rodwell, and U. Madhow, "Comprehensive digital correction of mismatch errors for a 400-msamples/s 80-dB SFDR time-interleaved analog-to-digital converter," IEEE Trans. Microwawe Theory Techniques, vel. 53, No. 3, pp. 1072-1082, Mar. 2005.

M. Seo, M. J. W. Rodwell, and U. Madhow, "Generalized blind mismatch correction for two-channel time-interleaved A-to-O converters," in Proc. IEEE Int. Cont. Acoustics, Speech, Signal Processing, Hawaii, USA, Apr. 2007.

M. Seo, M.J.W. Rodwell, "Generalized blind mismatch correction for a two-channel time interleaved ADC: Analytic approach," in Proc. IEEE Int. Symp. Circuits Syst, New Orleans, USA, May 27-30, 2007.

P. Satarzadeh, B. C. Levy, and P. J. Hurst, "Bandwidth mismatch correction for a two-channel time-interleaved A/0 converter," in Proc. IEEE Int. Symp. Circuits Syst., New 15 Orleans, USA, May 2007.

S. Mendel and C. Vogel, "A compensation method for magnitude response mismatches in two-channel time-interleaved analog-to-digital converters," in Proc. IEEE Int. Conf. Electronics, Circuits, Syst, Nice, France, Dec. 2006.

S. Mendel and C. Vogel, "On the compensation of magnitude response mismatches in M channel 5 time-interleaved ADCs," in Proc. IEEE Int. Symp. Circuits, Syst, New Orleans, USA, May 2007, pp. 3375-3378.

H. Johansson, "Relations Between Zero-IF Receiver I/Q and TI-ADC Channel Mismatches," IEEE Transactions on Signal Processing, Jul. 1, 2014, vol. 62, No. 13, pp. 3403-3414.

\* cited by examiner (a)

(b)

US 9,628,097 B2

METHODS AND DEVICES FOR HANDLING CHANNEL MISMATCHES OF AN I/Q DOWN-CONVERTED SIGNAL AND A TWO-CHANNEL TI-ADC

CROSS-REFERENCE TO RELATED APPLICATION

The present application is a national phase entry under 35 U.S.C. §371 of International Application No. PCT/EP2012/075901 filed Dec. 18, 2012 which is incorporated herein by reference.

TECHNICAL FIELD

Embodiments herein relate to methods, devices and uses of the devices. In particular embodiments herein relate to a method and device for handling an in-phase and quadrature (I/Q), channel mismatch of an I/Q down-converted signal, and to a method and device for handling a frequency dependent mismatch of a two-channel time-interleaved analog-to-digital converter (TI-ADC).

BACKGROUND

In the context of communication receivers, a potentially attractive solution for emerging low-cost and flexible radio architectures utilize zero-IF receivers that perform direct conversion to baseband through complex in-phase and quadrature (I/Q) down conversion mixers. A problem of such mixers is however that they, due to analog mismatch errors, exhibit an imbalance between the I and Q channels which causes a large mirror-frequency interference, corresponding to an unwanted contribution of the complex conjugate of the desired signal. The interference may e.g. be 50-100 dB stronger than the desired signal whereas the mixers alone may e.g. only provide some 30-40 dB attenuation, which obviously is insufficient in such cases. Therefore, there is a need to add additional digital circuitry in order to compensate for the I/Q channel mismatches (imbalances). In narrow-band applications it may suffice to model the interference as frequency independent, and the mismatch and compensation may then be done via two multiplier coefficients. With increasing bandwidths, it is however necessary to instead make use of frequency-dependent quantities for the I/Q channel mismatch modeling and compensation, including estimation of the mismatch. Such solutions for compensating the I/Q channel mismatch and that directly or indirectly comprise estimation of the I/Q channel mismatch are for example disclosed in:

L. Yu and W. Snelgrove, "A novel adaptive mismatch cancellation system for quadrature IF radio receivers," IEEE Trans. Circuits Syst. II: Analog and Digital Signal Processing, vol. 46, no. 6, pp. 789-801, June 1999, K. Pun, J. Franca, C. Azeredo-Leme, C. Chan, and C. Choy, "Correction of frequency-dependent I/Q mismatches in quadrature receivers," Electronics Lett., vol. 37, no. 23, pp. 1415-1417, November 2001, G. Xing, M. Shen, and H. Liu, "Frequency offset and I/Q imbalance compensation for direct-conversion receivers," IEEE Trans. Wireless Comm., vol. 4, no. 2, pp. 673-680, March 2005, B. Kirei, M. Neag, and M. Topa, "Blind frequency-selective I/Q mismatch compensation using subband processing," IEEE Trans. Circuits Syst. II: Express Briefs, vol. 59, no. 5, pp. 302-306, May 2012, and Anttila, M. Valkama, and M. Renfors, "Circularity-based I/Q imbalance compensation in wideband direct-conversion receivers," IEEE Trans. Vehicular Technology, vol. 57, no. 4, pp. 2099-2113, July 2008.

SUMMARY

An object of embodiments herein is to enable an alternative way of estimating and/or compensating in-phase and quadrature (I/Q), channel mismatch of an I/Q down-converted signal.

According to a first aspect of embodiments herein, the object is achieved by a method for handling an in-phase and quadrature, "I/Q", channel mismatch of an I/Q down-converted signal. A discrete-time complex valued signal r(n) based on an analog-to-digital conversion of the I/Q down-converted signal is obtained. The obtained discrete-time complex valued signal r(n) is oversampled by a factor of two or more. An intermediate signal v(n) if formed from the discrete-time complex valued signal r(n). The intermediate signal v(n) corresponds to the real part of a $\pi/2$ frequency shifted version of the obtained discrete-time complex valued signal r(n). A procedure for obtaining an estimate of a frequency dependent mismatch of a two-channel time-interleaved analog-to-digital converter, "TI-ADC" is applied on the formed intermediate signal v(n), thereby a TI-ADC mismatch estimate is obtained. The I/Q channel mismatch is then estimated and/or compensated based on the obtained TI-ADC mismatch estimate.

According to a second aspect of embodiments herein, the object is achieved by a device for handling an in-phase and quadrature, "I/Q", channel mismatch of an I/Q down-converted signal. The device comprises an obtaining circuitry configured to obtain a discrete-time complex valued signal r(n) based on an analog-to-digital conversion of the I/Q down-converted signal. The obtained discrete-time complex valued signal r(n) is oversampled by a factor of two or more. The device further comprises a forming circuitry configured to form an intermediate signal v(n) from the discrete-time complex valued signal r(n). The intermediate signal v(n) corresponds to the real part of a $\pi/2$ frequency shifted version of the obtained discrete-time complex valued signal r(n), where Re refers to the real part and j is the imaginary unit. Furthermore, the device comprises an applying circuitry configured to apply, on the formed intermediate signal v(n), a procedure for obtaining an estimate of a frequency dependent mismatch of a two-channel time-interleaved analog-to-digital converter, "TI-ADC", to thereby obtain a TI-ADC mismatch estimate. Moreover, the device comprises an estimating circuitry and/or compensating circuitry, configured to respectively estimate and/or compensate the I/Q channel mismatch based on the obtained TI-ADC mismatch estimate.

According to a third aspect of embodiments herein, the object is achieved by a use of the device according to the second aspect for estimating and/or compensating the I/Q channel mismatch of the I/Q down-converted signal.

According to a fourth aspect of embodiments herein, the object is achieved by a method for handling a frequency dependent mismatch of a two-channel time-interleaved analog-to-digital converter, "TI-ADC". A discrete-time signal v(n) based on an analog-to-digital conversion performed by the two-channel TI-ADC on a continuous-time signal is obtained. The discrete-time signal v(n) is bandlimited to a bandpass region. An intermediate signal r(n) that corresponds to $(-j)^n$ multiplied by an analytic representation of the obtained discrete-time signal v(n), where j is the imaginary unit, is formed. On the formed intermediate signal r(n) it is applied a procedure for obtaining an estimate of an in-phase and quadrature, "I/Q", channel mismatch of an I/Q down-converted signal. Thereby an I/Q channel mismatch estimate is obtained. The frequency dependent mismatch of the two-channel TI-ADC is estimated and/or compensated based on the obtained I/Q channel mismatch estimate.

According to a fifth aspect of embodiments herein, the object is achieved by a device for handling a frequency dependent mismatch of a two-channel time-interleaved analog-to-digital converter, "TI-ADC". The device comprises an obtaining circuitry configured to obtain a discrete-time signal v(n) based on an analog-to-digital conversion performed by the two-channel TI-ADC on a continuous-time signal. The discrete-time signal v(n) is bandlimited to a bandpass region. The device further comprises a forming circuitry configured to form an intermediate signal r(n) that corresponds to $(-j)^n$ multiplied by an analytic representation of the obtained discrete-time signal v(n), where j is the imaginary unit. Furthermore, the device comprises an applying circuitry configured to apply, on the formed intermediate signal r(n), a procedure for obtaining an estimate of an in-phase and quadrature, "I/Q", channel mismatch of an I/Q down-converted signal, to thereby obtain an I/Q channel mismatch estimate. Moreover, the device comprises an estimating circuitry and/or compensating circuitry, configured to respectively estimate and/or compensate the frequency dependent mismatch of the two-channel TI-ADC based on the obtained I/Q channel mismatch estimate.

According to a sixth aspect of embodiments herein, the object is achieved by a use of the device according to the fifth aspect for estimating and/or compensating the frequency dependent mismatch of the two-channel TI-ADC.

Underlying the above aspects is that the inventor has been able to show that the I/Q channel mismatch problem for I/Q down converted signals, i.e. complex valued signals that e.g. are present in low-IF, including zero-IF, receivers, is related to the real-signal channel-mismatch problem present in two-channel TI-ADCs. Hence, by the forming of respective intermediate signal referred to above, the I/Q channel mismatch may be estimated and/or compensated, which often is referred to as balanced, by utilizing any of the procedures available for mismatch estimation and/or compensation in TI-ADCs, and vice versa. Since these areas have developed independently of each other, one main advantage is that embodiments herein utilize procedures relating to estimating and/or compensating mismatches in areas where they previously have not been used, thereby alternative and in many cases improved estimation and/or compensation is enabled. Improvements are e.g. enabled in cases where there is a need to perform both I/Q and TI-ADC channel mismatch correction, since one may then utilize the same compensation and estimation principles for both applications which e.g. may save hardware resources. Also, the use of TI-ADC mismatch estimation and/or compensation procedures offers real-signal processing solutions to the complex-signal mismatch estimation and compensation problem for I/Q down converted signals in e.g. zero-IF receivers.

BRIEF DESCRIPTION OF THE DRAWINGS

Examples of embodiments herein are described in more detail with reference to the appended schematic drawings, in which.

DETAILED DESCRIPTION

Figure 1:
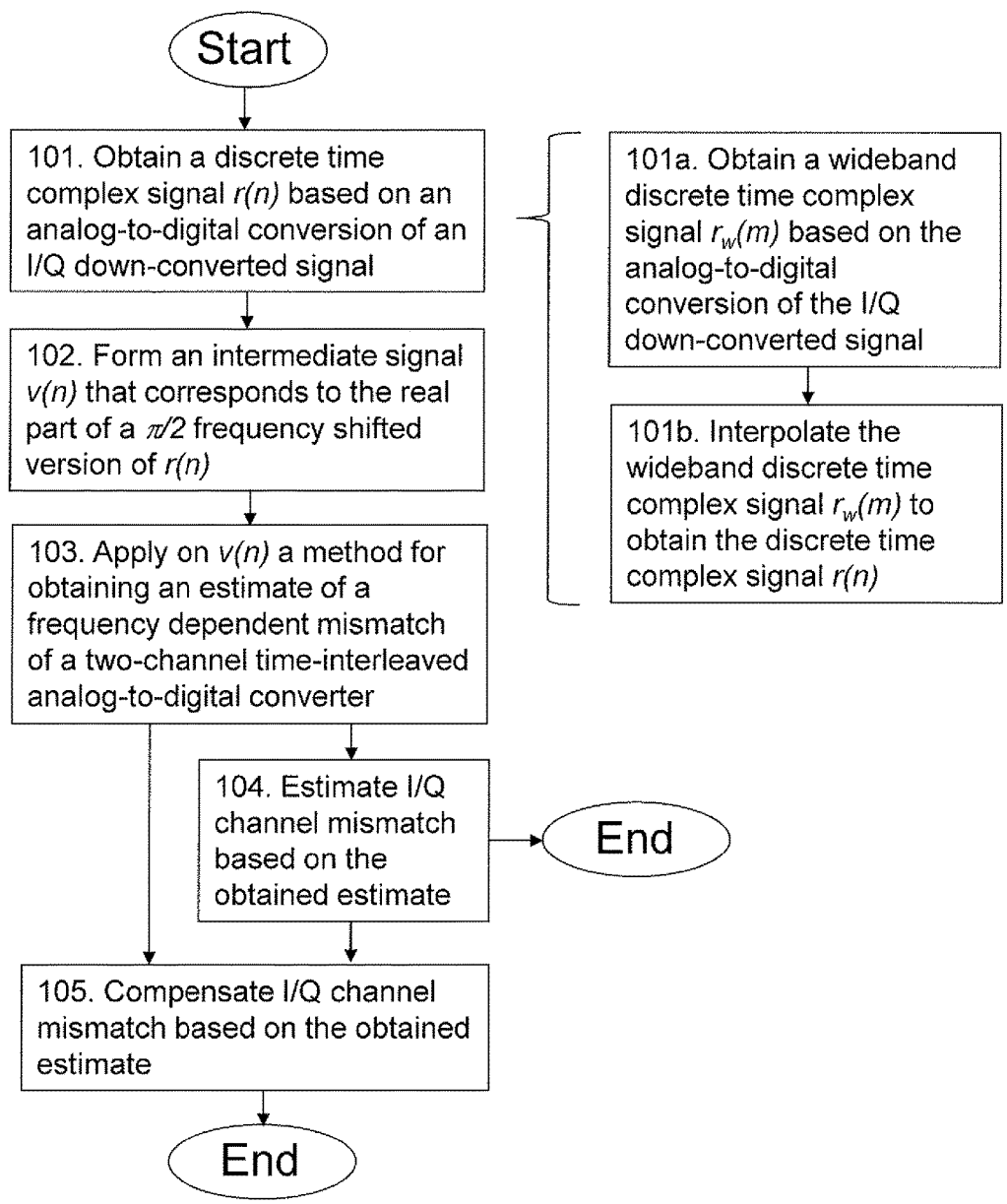
FIG. 1 is a flow chart illustrating a method for handling an in-phase and quadrature, "I/Q", channel mismatch of an I/Q down-converted signal, according to embodiments herein.

As part of the development towards embodiments herein, the inventor has been able to show that the in-phase and quadrature (I/Q) channel mismatch problem for I/Q down converted signals, i.e. complex valued signals that e.g. are present in low-IF, including zero-IF, receivers, is related to the real-signal channel-mismatch problem present in two-channel time-interleaved (TI) analog-to-digital converters (ADCs), which may be referred to by TI-ADCs. The problems may be viewed upon as related in the sense that, given one of the problems, it may be converted to the other problem via relatively simple signal processing operations. This means that an I/Q mismatch may be compensated, which often is referred to as balanced, by utilizing any of the procedures available for mismatch estimation and/or compensation in TI-ADCs, and vice versa. Hence, basically it becomes a matter of appropriate conversion of signals e.g. an "I/Q down converted signal" to a corresponding "TI-ADC signal" to be able to utilize estimation and/or compensation procedures available for "TI-ADC signals". After application of such a procedure, the estimated mismatch and/or compensated signal may be converted back to corresponding estimated "I/Q signal" mismatch and/or compensated "I/Q signal".

In the literature, the compensation schemes for, and solutions in general relating to, these two different "problem domains" have been developed independently of each other. In other words, the compensation procedures for I/Q down converted signals in a "I/Q problem domain" have been developed without taking into account the knowledge from compensation procedures for TI-ADCs in a "TI-ADC problem domain" and vice versa.

The above may be seen as a basic concept underlying embodiments herein and may be advantageously utilized e.g. in cases where there is a need to perform both I/Q and TI-ADC channel mismatch correction, since one may then utilize the same compensation and estimation principles for both applications which e.g. may save hardware resources. Also, the use of TI-ADC mismatch estimation and/or compensation offers real-signal processing solutions to the complex-signal mismatch estimation and compensation problem for I/Q down converted signals in e.g. zero-IF receivers.

From the basic concept discussed above, it may be realized that it is possible with two basic options or alternatives of how to carry out the compensation. This is discussed in further detail below, but in short the first alternative is that, given one of a I/Q or TI-ADC mismatch problem, both the estimation and compensation are performed by using techniques available for the other problem. The second one is that only the estimation part is done via techniques available for the other problem, whereas the compensation is done in a more conventional way for the original problem.

In view of the above-mentioned relation, it is suitable to discuss TI-ADC related problems and existing solutions before presenting more detailed information about embodiments herein, that is, discuss TI-ADC related problems and solutions in a similar manner as I/Q down converter related problems and solutions were discussed in the Background section above.

In the context of analog-to-digital conversion, time interleaving of multiple parallel analog-to-digital converters (ADCs), i.e. TI-ADC, is a potentially attractive technique to increase the effective sampling rate of the overall converter. Using an M-channel time-interleaved ADC, the effective sampling rate is increased by a factor of M. Unfortunately, the effective resolution of the individual channel converters is not maintained in the overall converter because of channel mismatch errors. It is therefore necessary to compensate for these errors in order to restore the resolution. Up to a certain resolution, one may assume that the channel frequency responses have frequency-independent magnitude and phase delay responses, which corresponds to static gain and linear-phase (time-skew) mismatch errors. Without gain errors, this case corresponds to non-uniform sampling and the problem is then to recover the uniform-sampling sequence from the non-uniform-sampling sequence. Numerous papers have addressed this problem over the last decades. However, to reach a very high resolution for high-speed conversion, one needs to extend the channel model to general frequency responses, thus with frequency dependent magnitude and phase delay responses. In this case, one has to compensate for these frequency-response mismatch errors, not only static gain and linear-phase parts which correspond to approximations of the true response. Such more general problem and various procedures for solving the problem, i.e. for estimating and/or compensating the mismatch, are for example disclosed in:

T. Tsai, P. J. Hurst, and S. H. Lewis, "Bandwidth mismatch and its correction in time-interleaved analog-to-digital converters," IEEE Trans. Circuits Syst. II, vol. 53, no. 10, pp. 1133-1137, October 2006, M. Seo, M. J. W. Rodwell, and U. Madhow, "Comprehensive digital correction of mismatch errors for a 400-msamples/s 80-dB SFDR time-interleaved analog-to-digital converter," IEEE Trans. Microwave Theory Techniques, vol. 53, no. 3, pp. 1072-1082, March 2005, S. Mendel and C. Vogel, "A compensation method for magnitude response mismatches in two-channel time-interleaved analog-to-digital converters," in Proc. IEEE Int. Conf. Electronics, Circuits, Syst., Nice, France, December 2006, S. Mendel and C. Vogel, "On the compensation of magnitude response mismatches in M channel 5 time-interleaved ADCs," in Proc. IEEE Int. Symp. Circuits, Syst., New Orleans, USA, May 2007, pp. 3375-3378, M. Seo, M. J. W. Rodwell, and U. Madhow, "Generalized blind mismatch correction for two-channel time-interleaved A-to-D converters," in Proc. IEEE Int. Conf. Acoustics, Speech, Signal Processing, Hawaii, USA, April 2007, M. Seo, M. J. W. Rodwell, "Generalized blind mismatch correction for a two-channel time interleaved ADC: Analytic approach," in Proc. IEEE Int. Symp. Circuits Syst., New Orleans, USA, May 27-30 2007, P. Satarzadeh, B. C. Levy, and P. J. Hurst, "Bandwidth mismatch correction for a two-channel time-interleaved A/D converter," in Proc. IEEE Int. Symp. Circuits Syst., New Orleans, USA, May 2007, H. Johansson and P. Löwenborg, "A least-squares filter design technique for the compensation of frequency-response mismatch errors in time interleaved A/D converters," IEEE Trans. Circuits Syst. II: Express Briefs, vol. 55, no. 11, pp. 1154-1158, 2008, H. Johansson, "A polynomial-based time-varying filter structure for the compensation of frequency-response mismatch errors in time-interleaved ADCs: Special issue on DSP techniques for RF/analog circuit impairments," IEEE J. Selected Topics Signal Processing, vol. 3, no. 3, pp. 384-396, June 2009, Y. C. Lim, Y. X. Zou, J. W. Lee, and S. C. Chan, "Time-interleaved analog-to-digital converter compensation using multichannel filters," IEEE Trans. Circuits Syst. I: Regular Papers, vol. 56, no. 10, pp. 2234-2247, October 2009, and C. Vogel and S. Mendel, "A flexible and scalable structure to compensate frequency response mismatches in time-interleaved ADCs," IEEE Trans. Circuits Syst. I: Regular papers, vol. 56, no. 11, pp. 2463-2475, November 2009.

It is common to use the term calibration in the context of error correction of circuits. However, in the context herein, calibration amounts to estimation of and compensating the channel mismatches. The compensation is commonly done in the time domain using one or several filters of a certain filter order. Estimation typically amounts to determining the filter coefficients. This may be done indirectly, e.g. given measured channel response mismatches, or directly by e.g. minimizing an appropriate cost measure, e.g. the degree of improperness or cyclo-stationarity as in some of the prior art procedures mentioned above. Thus an estimate of a mismatch comprise information that directly or indirectly may be used as filter coefficients for the compensation. Indirectly estimated filter coefficients may e g. involve estimating mismatch errors and then it is a matter of filter design to determine filter coefficients based on the estimated mismatch errors. The prior art, e.g. as mentioned above, regarding estimation and/or compensation procedures, schemes, structures, etc. provide detailed examples of how results from estimation may be used in compensation and how estimation and compensation may be carried out. Such details are therefore not discussed in any detail herein. Focus is instead on the above mentioned relations, signal conversions, and on how this may be utilized.

From the above it may be realized that when the term "estimate" is used as a subject herein, and also "estimated mismatch", this may correspond to or be represented by one or more parameters that correspond to or may be used to determine filter coefficients for compensating the mismatch.

The following explanations are mainly intended as an aid for other readers of this disclosure than a person skilled in the art, i.e. to readers that in contrast to the person skilled in the art may not well recognize what is meant and/or referred to by some denominations and expressions that are used herein. A discrete-time (DT) signal, for example denoted $x_{DT}$, is referred to by $x_{DT}(n)$, where $x_{DT}$ is just an example denotation and n is an integer variable referring to discrete time instances where the discrete-time signal $x_{DT}$ is defined. This may be compared to a continuous-time (CT) signal, for example denoted $x_{CT}$, referred to by $x_{CT}(t)$, where $x_{CT}$ is just an example denotation and t is a time variable referring to continuous-time values where $x_{CT}$ is defined. The time distance between two consecutive integers n is typically denoted T and typically corresponds to a sample period. In practice a discrete-time signal, e.g. $x_{DT}(n)$, corresponds to a sequence of values of $x_{DT}$, a respective value for each integer n, for example where n=1, 2, . . . N. A typical frequency variable used for CT signals is the angular frequency $\omega$, with unit radian per second (rad/s). A typical frequency variable used for DT signals is $\omega T$, with unit radian (rad). A complex valued signal comprises a real part and an imaginary part. The real part may be referred to as real valued part and the imaginary part may be referred to as imaginary valued part. If the real part is termed e.g. RE(n) and the imaginary part e.g. IM(n), the complex signal may be expressed RE(n)+jIM(n), where j is the so called imaginary unit, where $j=\sqrt{-1}$.

Embodiments herein relating to a method for handling an in-phase and quadrature, "I/Q", channel mismatch of an I/Q down-converted signal, will now be elaborated and described with reference to the flowchart depicted in FIG. 1. The method comprises the following actions, which actions may be taken in any suitable order. Further, actions may be combined.

Action 101

A discrete-time complex valued signal r(n) based on an analog-to-digital conversion of the I/Q down-converted signal is obtained. The obtained signal is oversampled by a factor of two or more. An oversampling of two has a particular advantage since it enables a simple and efficient implementation. As realized by the skilled person, an oversampling of at least two corresponds to that r(n) has an angular cut-off frequency such that $\omega_c T < \pi/2$, and r(n) thus being bandlimited to $[-\omega_c T, \omega_c T]$, where $\omega_c$ is the angular cut-off frequency and T corresponds to the sample period used in the analog-to-digital conversion.

In some embodiments, Action 101 comprises a sub-action 101a where a wideband discrete-time complex valued signal $r_w(m)$ is obtained based on the analog-to-digital conversion of the I/Q down-converted signal. "Wideband" here indicates that that $r_w(m)$ has an angular cut-off frequency such that $\omega_c T \geq \pi/2$, where $\omega_c$ is the angular cut-off frequency and T corresponds to the sample period used in the analog-to-digital conversion. In these embodiments, sub-action 101a is then followed by a sub-action 101b where the $r_w(m)$ is interpolated to obtain r(n) that is oversampled by a factor of two or more. An advantage associated with these embodiments is relaxed requirements on the analog-to-digital conversion, which may be made at lower sampling rate, and still efficient implementation of the method is enabled.

In some embodiments the interpolation is made by a factor of two or more. This makes it possible to use no oversampling at all in the analog-to-digital conversion, instead accomplishing all oversampling by interpolation. However, note that in some embodiments there may be some oversampling provided by the analog-to-digital conversion and some by interpolation, resulting in r(n) that is oversampled by a factor of two or more.

In some embodiments the interpolation may be performed by means of a half-band filter. This enables particularly efficient implementation and is of particular interest when r(n) is oversampled by a factor of two.

Action 102

An intermediate signal v(n) is formed, which intermediate signal v(n) corresponds to the real part of a $\pi/2$ frequency shifted version of the obtained discrete-time complex valued signal r(n), i.e. the intermediate signal v(n) is real valued. This corresponds to the above discussed conversion from a "I/Q signal" problem to a "TI-ADC signal" problem.

In some embodiments the intermediate signal v(n) corresponds to $2\text{Re}\{r(n)j^n\}$, where Re refers to the real part and j is the imaginary unit, i.e. $\text{Re}\{r(n)j^n\}$ refers to the real part of the complex signal $r(n)j^n$. The more detailed examples below are based on such embodiments. As realized by the skilled person, r(n) multiplied by $j^n$ corresponds to shifting r(n) in the frequency domain $\pi/2$ "to the right". However, it should be realized that it is a matter of adapting, within the capacity of the skilled person, the more detailed examples in case of embodiments where for example $\text{Re}\{r(n)j^n\}$ is scaled differently than by 2 and/or if the frequency shift instead is "to the left", i.e. in the opposite direction. As should also be realized, forming of the intermediate signal v(n) may be practically implemented in several different ways available to the skilled person. In some embodiments, the forming of v(n) may comprise alternatingly taking every second sample from respective real and imaginary parts of r(n). This enables particularly efficient implementation and is discussed in some further detail below.

Action 103

A procedure for obtaining an estimate of a frequency dependent mismatch of a two-channel time-interleaved analog-to-digital converter, "TI-ADC", is applied on the formed intermediate signal v(n). Thereby a TI-ADC mismatch estimate is obtained.

As recognized by the skilled person, there are a number of procedures for obtaining an estimate of a frequency dependent mismatch of a two-channel TI-ADC that may be used in the present action, for example any of the procedures referred to in the introductory part of the detailed description and that relates to estimating. By the forming of the intermediate signal v(n) according to the previous action, procedures developed for obtaining an estimate of a frequency dependent mismatch of a two-channel TI-ADC become usable in the present context, i.e. in the context of handling I/Q channel mismatch of an I/Q down-converted signal.

For facilitating understanding, one way of looking upon the above described Actions 101-103, is that r(n) may be considered obtained in a "I/Q problem domain", then r(n) is converted to v(n) and thereby transferred to a "TI-ADC problem domain", which enable use of existing and upcoming procedures in the "TI-ADC problem domain" for solving mismatch problems actually relating to the "I/Q problem domain".

Action 104

This is an optional action, where the I/Q channel mismatch is estimated based on the obtained TI-ADC mismatch estimate from Action 103. The obtained TI-ADC mismatch estimate comprises information that may be converted to an estimate of the I/Q channel mismatch, or the information may be extracted and/or used in some other way depending on application and/or choice of implementation available to the skilled person. Note that in some embodiments, see e.g., Action 105 below, the I/Q channel mismatch may be compensated based on the obtained TI-ADC mismatch estimate without explicitly estimating the I/Q channel mismatch as such.

It may be considered implicit that estimation of the I/Q channel mismatch results in that an estimate of the I/Q channel mismatch is obtained, which estimate is suitable to use for compensating the I/Q channel mismatch. For example, as discussed above, the estimate may be considered to directly or indirectly relate to filter coefficients that may be used for compensation of the I/Q channel mismatch. In case of embodiments herein that comprise no compensation, the estimation would thus typically be followed by providing the obtained estimate for further use, so it may be used in compensation of the I/Q channel mismatch, e.g. by providing it to a circuit or device for compensating the I/Q channel mismatch.

Action 105

This is an optional action, where the I/Q channel mismatch is compensated based on the obtained TI-ADC mismatch estimate from Action 103.

In some embodiments of a first alternative, the I/Q channel mismatch is compensated by applying, on the intermediate signal v(n) and based on the obtained TI-ADC mismatch estimate, a procedure for compensating a frequency dependent mismatch of a two-channel TI-ADC. This procedure may be a procedure that is associated with, and typically disclosed together with, the procedure for obtaining the estimate in Action 103, i.e. for obtaining the estimate of the frequency dependent mismatch of the two-channel TI-ADC. Thereby a compensated version $v_c(n)$ of the intermediate signal v(n) is obtained. A compensated, i.e. balanced, version, $r_c(n)$ of the discrete-time complex valued signal r(n) may then be formed, which compensated version $r_c(n)$ corresponds to a $\pi/2$ frequency shift of an analytic representation of said compensated version $v_c(n)$, which $\pi/2$ frequency shift is in the opposite direction compared to said $\pi/2$ frequency shifted version of the obtained discrete-time complex valued signal r(n). That is, the frequency shift here should be in the opposite direction to the frequency shift in Action 102, i.e. "to the left" if Action 102 involved a frequency shift "to the right" and vice versa. For example, if in Action 102 the intermediate signal v(n) corresponds to $2\text{Re}\{r(n)j^n\}$, the compensated version $r_c(n)$ may be expressed as corresponding to an analytic representation of said compensated version $v_c(n)$ multiplied by $(-j)^n$. The present action may be viewed upon as a conversion that is in a reverse direction compared to a conversion performed by Action 102. This is further discussed below. The embodiments of the first alternative may be viewed upon as the actual compensating of the I/Q down-converted signal is made in the above-mentioned "TI-ADC problem domain", resulting in a compensated signal $v_c(n)$ that comprises information corresponding to, and that may be converted to, the compensated version $r_c(n)$ of r(n) in the original "I/Q problem domain". Similarly as mentioned above for Action 104, the information may be extracted and/or used in some other way depending on application and/or choice of implementation available to the skilled person.

In some embodiments of a second alternative, the I/Q channel mismatch is compensated by first estimating, based on the obtained TI-ADC mismatch estimate, the I/Q channel mismatch. Then the I/Q channel mismatch is compensated by applying, based on the discrete-time complex valued signal r(n) and the estimated I/Q channel mismatch, a procedure for compensating an I/Q channel mismatch of an I/Q down-converted signal. Thereby a compensated version $r_c(n)$ of the discrete-time complex valued signal r(n) is obtained. That is, these embodiments may be viewed upon as the estimating of the I/Q channel mismatch is made in the "TI-ADC problem domain" through the obtained TI-ADC mismatch estimate. Thereafter the actual compensating of the I/Q down-converted signal may be carried out in the "I/Q problem domain" and may use any conventional procedure for compensating I/Q channel mismatch based on a first estimated I/Q channel mismatch.

Reasons for implementing embodiments of the second alternative instead of the first alternative include if a practical situation results in that the compensation in the "TI-ADC problem domain" would become more complex than compensation in the "I/Q problem domain". However, in some other practical situations, the opposite may be true. Hence, in a practical situation, a complexity investigation may first be carried out and then determine if embodiments of the first or second alternative is best to implement.

Figure 2:
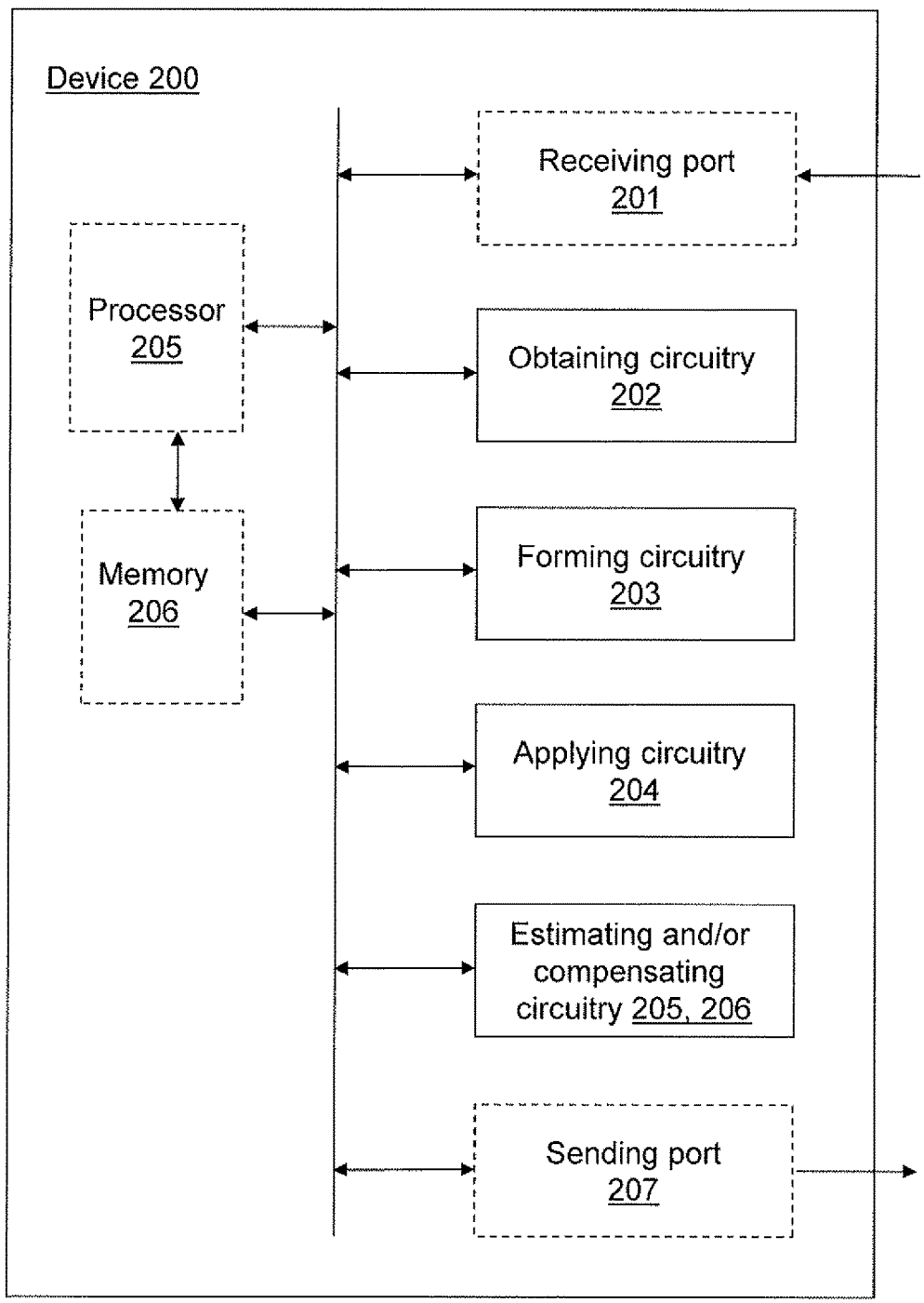
FIG. 2 is a schematic block diagram illustrating a device for handling an in-phase and quadrature (I/Q) channel mismatch of an I/Q down-converted signal, according to embodiments herein.

To perform the actions 101-105 above for handling the I/Q channel mismatch of the I/Q down-converted signal, a device 200 may be provided that comprises an arrangement schematically depicted in FIG. 2.

In some embodiments, the device 200 comprises a receiving port 210 that may be configured to receive said discrete-time complex valued signal r(n), $r_w(m)$ and/or the I/Q down-converted signal from an external device or circuitry.

The device 200 comprises an obtaining circuitry 202, configured to obtain said discrete-time complex valued signal r(n) that is based on an analog-to-digital conversion of the I/Q down-converted signal and is oversampled by a factor of two or more. In some embodiments, the obtaining circuitry 202 is configured to obtain said wideband discrete-time complex valued signal $r_w(m)$ and to interpolate $r_w(m)$ to obtain r(n). In some embodiments, the obtaining circuitry 202 is configured to interpolate $r_w(m)$ by a factor of two or more. The obtaining circuitry 202 may be configured to perform the interpolation by means of said half-band filter.

The obtaining circuitry 202 may be configured to obtain r(n) or $r_w(m)$ by receiving it, directly or via the receiving port 210, from another device or circuitry. In some embodiments the obtaining circuitry 202 may be configured to obtain the I/Q down-converted signal by receiving it, directly or via the receiving port 210, from another device or circuitry. Such another circuitry may be integrated with the device 200. After obtaining the I/Q down-converted signal, the obtaining circuitry 202 may be configured to obtain $r_w(m)$ or r(n) by performing an analog-to-digital conversion of the I/Q down-converted signal.

The device 200 further comprises a forming circuitry 203, configured to form said intermediate signal v(n) that corresponds to the real part of a $\pi/2$ frequency shifted version of the obtained discrete-time complex valued signal r(n). In some embodiments, the forming circuitry 203 may be configured to alternatingly taking every second sample from respective real and imaginary parts of the obtained discrete-time complex valued signal r(n).

Moreover, the device 200 comprises an applying circuitry 204, configured to apply, on the formed intermediate signal v(n), said procedure for obtaining an estimate of a frequency dependent mismatch of a two-channel TI-ADC and to thereby obtain a TI-ADC mismatch estimate.

The device 200 also comprises an estimating circuitry 205 and/or compensating circuitry 206, configured to respectively estimate and/or compensate the I/Q channel mismatch based on the obtained TI-ADC mismatch estimate. Note that the estimating circuitry 205 and/or compensating circuitry 206 is shown as one entity to simplify presentation, but that it shall be understood that what is shown is meant to include also the situation with either one of the estimating circuitry 205 and the compensating circuitry 206, or both circuitries but separated.

In some embodiments, corresponding to said embodiments of a first alternative as mentioned above under Action 105, the compensating circuitry 206 is configured to compensate the I/Q channel mismatch by applying, on the intermediate signal v(n) and based on the obtained TI-ADC mismatch estimate, said procedure for compensating a frequency dependent mismatch of a two-channel TI-ADC, to thereby obtain the compensated version $v_c(n)$ of the intermediate signal v(n). Moreover, the compensating circuitry 206 may be further configured to form said compensated version $r_c(n)$ of the discrete-time complex valued signal r(n).

In some embodiments, corresponding to said embodiments of a second alternative as mentioned above under Action 105, the estimating circuitry 205 and compensating circuitry 206 are configured to compensate the I/Q channel mismatch by first estimating, based on the obtained TI-ADC mismatch estimate, the I/Q channel mismatch, then compensating the I/Q channel mismatch by applying, on the discrete-time complex valued signal r(n) and based on the estimated I/Q channel mismatch, said procedure for compensating an I/Q channel mismatch of an I/Q down-converted signal, to thereby obtain the compensated version $r_c(n)$ of the discrete-time complex valued signal r(n).

In some embodiments the device 200 comprises a sending port 207 that may be configured to send information resulting from the estimating circuitry 205, e.g. an obtained estimate, and/or from the compensating circuitry 206, e.g. a compensated signal, to an external device or circuitry.

In some embodiments, the estimating circuitry 205 may be configured to, directly or via, the sending port 207, send the estimated I/Q channel mismatch, or information comprised therein, to another device or circuitry for further handling, e.g. another device or circuitry for compensation of the mismatch. In some embodiments such another circuitry may be integrated with the device 200. In some embodiments, the compensating circuitry 206 may be configured to, directly or via the sending port 207, send the compensated I/Q channel mismatch, typically in the form of a compensated version of the I/Q down-converted signal, to another device or circuitry for further handling, e.g. for use of the compensated version of the I/Q down-converted signal. Also here such another circuitry may be integrated with the device 200.

The embodiments of the device 200 may be implemented through one or more processors, such as a processor 205 in the device 200 depicted in FIG. 2, together with computer program code for performing the functions and actions of embodiments herein. In some embodiments the circuitry discussed above may be fully or partially implemented by the processor 205.

The computer program code mentioned above may also be provided as a computer program product, for instance in the form of a data carrier carrying computer program code for performing the embodiments herein when being loaded into and executed on the device 200. One such carrier may be in the form of a CD or DVD. It is however feasible with other data carriers such as a memory stick, memory card or hard drive. The computer program code may furthermore be provided as pure program code on a server for download to the device 200. The computer program code may furthermore be provided in the form of a data file or files on, or available through, a server for download. The file or files may be executable files for direct or indirect download to and execution on the device 200, or may be for intermediate download and compilation to make them executable before download to and for execution in the device 900. The server may be accessible over a computer network, such as the Internet, and may e.g. be a web or ftp server.

The device 200 may further comprise a memory 206 comprising one or more memory units. The memory 206 is arranged to store data, such as values comprised in $r_w(m)$, r(n), v(n), and/or resulting from the estimating and/or compensating, and configurations and/or software code to perform the method when being executed in the device 200.

Those skilled in the art will also appreciate that the circuitry and ports 201-207 may refer to a combination of analog and digital circuits, and/or one or more processors, such as the processor 205, configured with software and/or firmware (e.g., stored in memory) that, when executed by the one or more processors, perform as described above. One or more of these processors, as well as the other digital hardware, may be included in an application-specific integrated circuit (ASIC), a Field Programmable Gate Array (FPGA), and/or several processors and various digital hardware may be distributed among several separate components, whether individually packaged or assembled into a system-on-a-chip (SoC).

It is evidently so that device 200 described above may be used for estimating and/or compensating the I/Q channel mismatch of the I/Q down-converted signal.

Some particulars, advantages and examples relating to the method and device described above in connection with FIGS. 1 and 2 will now be provided.

Figure 3:
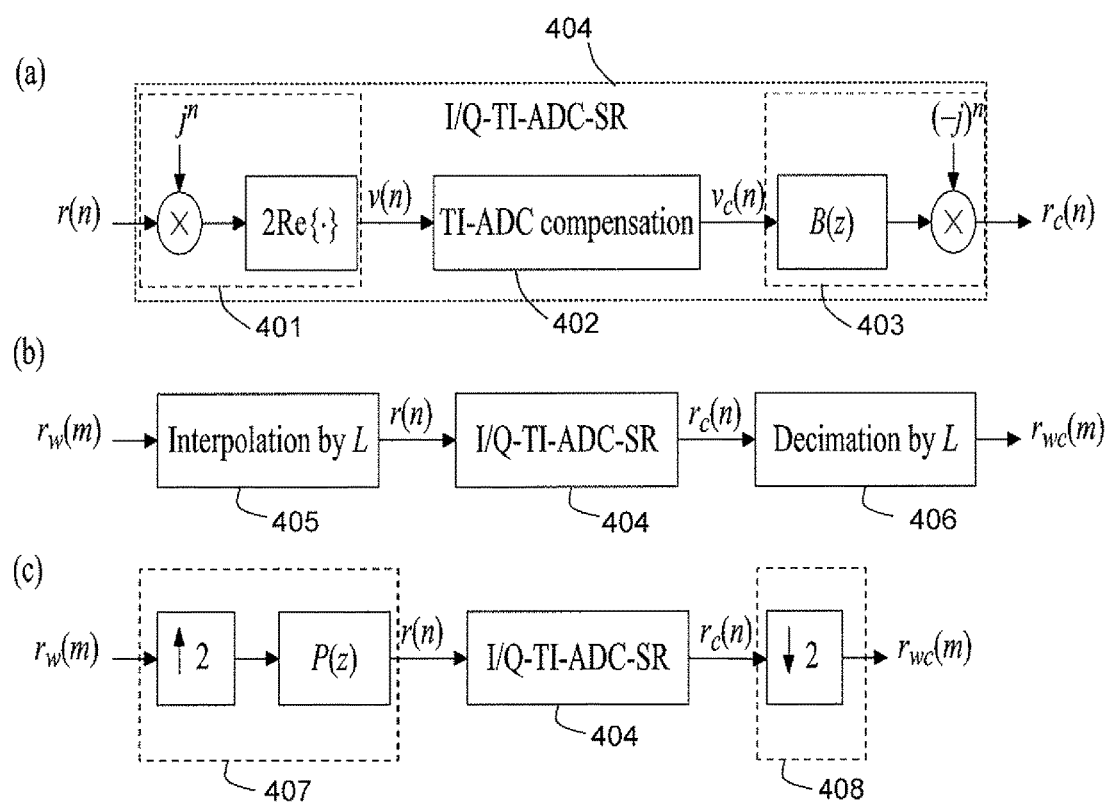
FIG. 3(a)-(c) are schematic block diagrams illustrating situations where embodiments herein are utilized to compensate channel mismatch of an I/Q down-converted signal.

FIG. 3(a) is a schematic block diagram illustrating a situation where embodiments herein are utilized to compensate channel mismatch of an I/Q down-converted signal. The signals r(n), v(n) according to the above are easily identified. It is realized that block 401 corresponds to Action 102 and block 402 to Actions 103-105. The signals $v_c(n)$ and $r_c(n)$ indicate respective corresponding signals as v(n) and r(n) but after compensation. Since compensation is made on v(n), thus in the "TI-ADC problem domain", it is realized that the situation corresponds to the first alternative of embodiments discussed above under Action 105. The compensation is performed in block 402 denoted as I/Q-TI-ADC-SR, where "SR" stands for single rate. As mentioned above, in principle any procedure available for TI-ADC mismatch compensation may be used for the implementation of this block. In block 403 a conversion from $v_c(n)$ to $r_c(n)$ is performed, which may be viewed upon as a conversion "back" from the "TI-ADC problem domain" to the "I/Q problem domain". It is realized that all information about the compensated signal is in $v_c(n)$ and that in some embodiments this information may be utilized without any actual converting back to the "I/Q problem domain". However, converting back is typically convenient and desirable. How to accomplish the conversion back, e.g. as illustrated by block 403 in FIG. 4(a), may be derived based on the conversion involved in block 401 and Action 102. For example, in block 403 the conversion from $v_c(n)$ to $r_c(n)$ is accomplished by first forming an analytic signal corresponding to $v_c(n)$ and the resulting analytic signal is then multiplied by $(-j)^n$, corresponding to a frequency shift by $\pi/2$ "to the left". The analytic signal is here generated via a complex half-band filter $B(z)$ (Hilbert transformer) with an impulse response $b(n)$ having the ideal frequency response:

$$B(e^{j\omega T}) = \begin{cases} 1, & \omega T \in [\pi/2 - \omega_c T, \pi/2 + \omega_c T] \\ 0, & \omega T \in [-\pi/2 - \omega_c T, -\pi/2 + \omega_c T]. \end{cases}$$

As realized by the skilled person, it may suffice to form a signal that corresponds to an analytic representation of $v_c(n)$ multiplied by $(-j)^n$ and that this may be carried out and be implemented in numerous different ways, the above being one example. For example, the analytic representation of $v_c(n)$ multiplied by $(-j)^n$ corresponds to the positive frequency content in $v_c(n)$ shifted $\pi/2$ "to the left", or equivalently the negative frequency content in $v_c(n)$ shifted $\pi/2$ "to the right" and then taking the complex conjugate, i.e. mirror imaging.

FIG. 3(b) is a schematic block diagram illustrating a situation where embodiments herein are utilized to compensate channel mismatch of an I/Q down-converted signal as in FIG. 3(a), but where, as in Action 101, $r_w(m)$ is obtained and interpolation is used, see block 405, to accomplish the oversampling by a factor of two or more. Note that block 404 corresponds to what is shown in FIG. 3(a). After the compensation, e.g. using the scheme depicted in FIG. 3(a), the compensated signal $r_c(n)$ is downsampled to obtain the final compensated wideband signal, $r_w(n)$. As it suffices to ensure that $\omega_c T < \pi/2$, it is possible to use interpolation by a factor of two, as illustrated in FIG. 4(c), which leads to a particularly efficient scheme. Interpolation by two may be efficiently implemented using a half-band filter. Every other impulse response value of a half-band filter is zero, except for the center tap which equals ½. For a non-causal version of a real valued half-band FIR filter, the transfer function can be written in polyphase form as $P(z)=1+z^{-1}P_1(z^2)$, where $P_1(z)$ corresponds to an odd-order linear-phase FIR filter with symmetric coefficients. The corresponding polyphase structures is schematically illustrated in FIG. 4(a), and a corresponding implementation based on a commutator is schematically illustrated in FIG. 4(b).

In Action 102, $v(n)$ is formed from the complex valued signal $r(n)$, which may involve a conversion so that $v(n)$ corresponds to $2\text{Re}\{r(n)j^n\}$. This includes that $r(n)$ is multiplied by $j^n$ which is a periodic sequence with a period of four and with the values $1, j, -1, j$ within one period. The complex valued signal $r(n)$ may be written $r_{re}(n)+jr_{im}(n)$. Hence, $2\text{Re}\{r(n)j^n\}$ and thus $v(n)$ may be written $2[r_{re}(0), -r_{im}(1), -r_{re}(2), r_{im}(3), r_{re}(4), \ldots]$. In other words, the conversion from $r(n)$ to $v(n)$ need not include any arithmetic operations, except from a trivial multiplication by two. Instead, forming $v(n)$ may comprise alternatingly taking every second sample from the real and imaginary parts of $r(n)$ as mentioned above. Using multirate theory, the conversion may thus involve downsamplers and upsamplers as depicted in FIG. 5(a). In practice, the upsamplers and summation may be implemented by means of a commutator as depicted in the equivalent scheme in FIG. 5(b). Here, the index m is used to indicate another, here lower, sampling rate.

Figure 4:
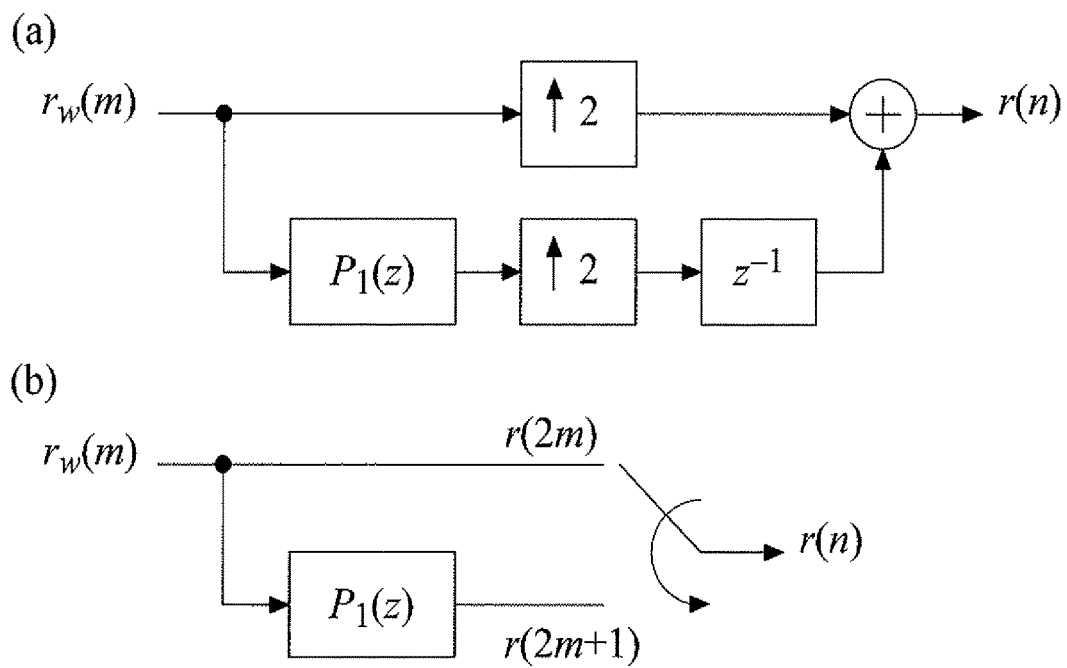
FIG. 4(a)-(b) are schematic block diagrams illustrating an example of polyphase interpolation by a factor of two, the principle and an implementation based on a commutator.
Figure 5:
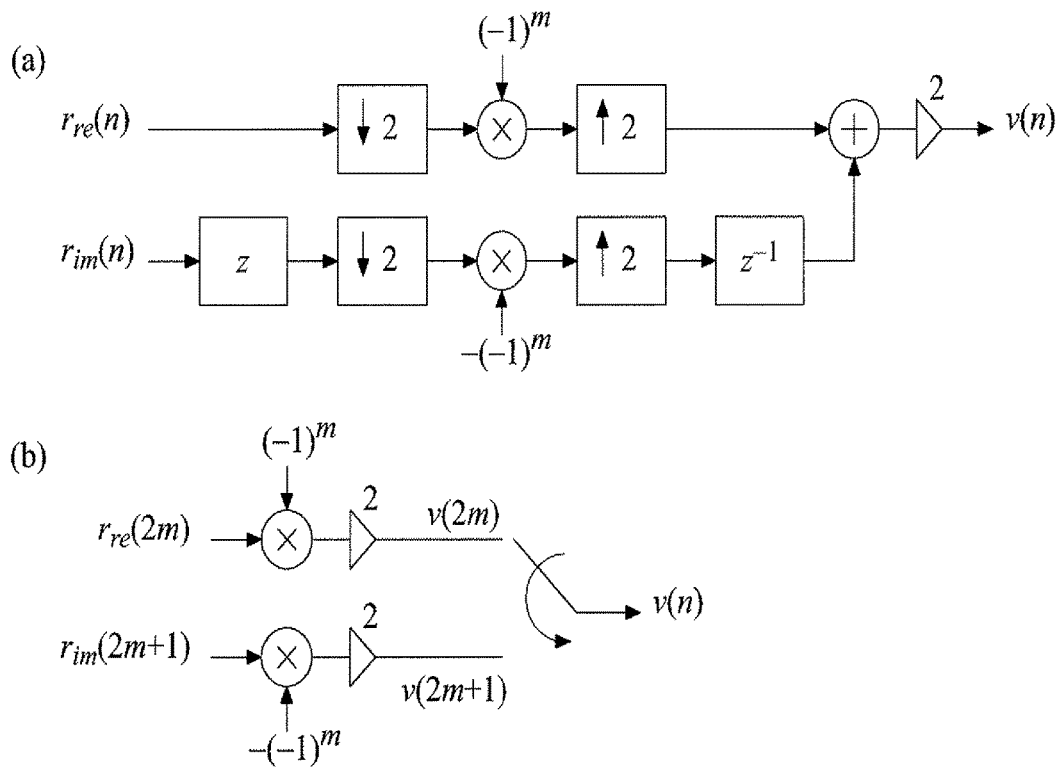
FIG. 5(a)-(b) are schematic block diagrams illustrating an example of a conversion from r(n) to v(n), the principle and an implementation based on a commutator.
Figure 6:
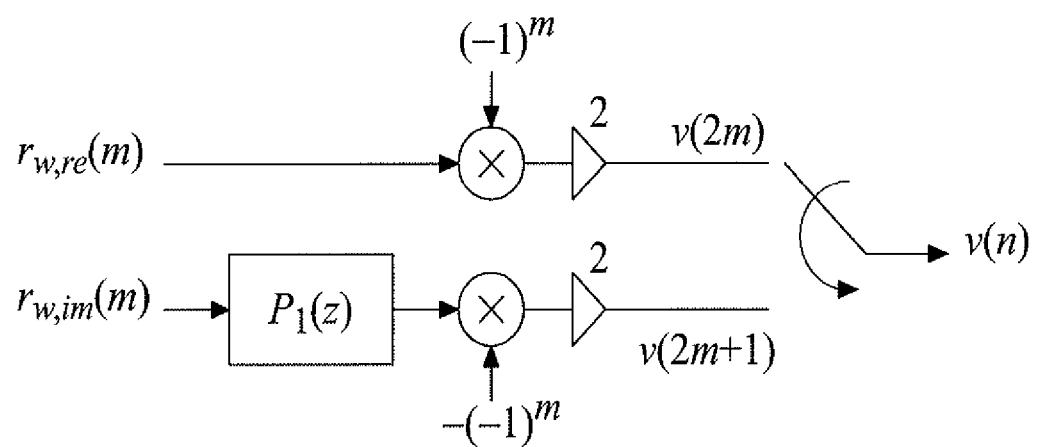
FIG. 6 is a schematic block diagram illustrating an example of simultaneous interpolation by two and conversion from $r_w(m)$ to v(n).

By combining the interpolator scheme in FIG. 4 with the conversion scheme in FIG. 5, the result is the scheme in FIG. 6 that simultaneously interpolates and converts the signal from the complex to the real domain.

Figure 7:
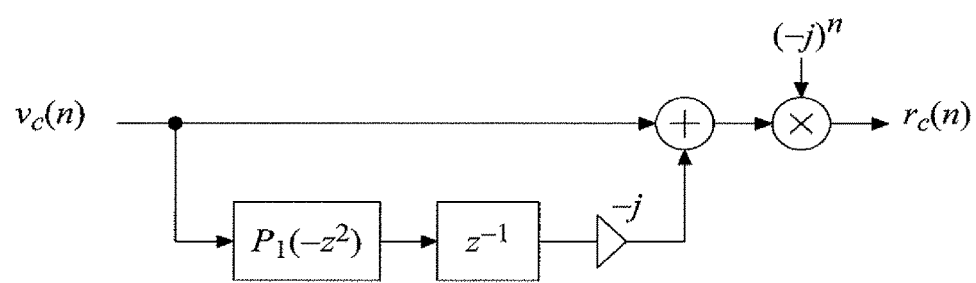
FIG. 7(a)-(b) are schematic block diagrams illustrating a respective example of conversion from $v_c(n)$ to $r_c(n)$, and simultaneous decimation by two and conversion from $v_c(m)$ to $r_{wc}(n)$.
Figure 7:
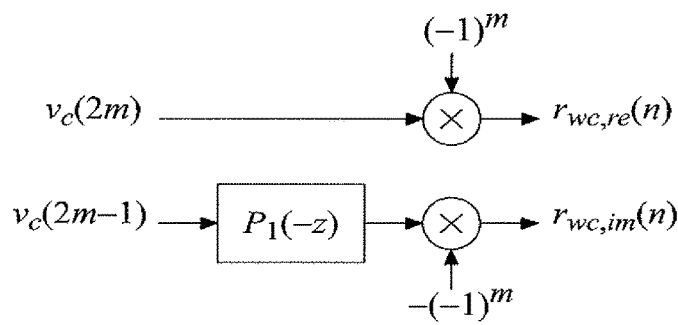

In block 403 of FIG. 3(a), the real signal $v_c(n)$ is to be converted to a complex valued signal $r_c(n)=r_{c,re}(n)+jr_{c,im}(n)$. As already indicated above in connection with FIG. 3(a), this may be accomplished by first filtering $v_c(n)$ via the Hilbert transformer $B(z)$ and then multiplying the so obtained signal by $(-j)^n$. An efficient Hilbert transformer may be obtained by frequency shifting a half-band filter. Starting with the half-band filter $P(z)$ as above, $B(z)$ may thus be obtained according to $B(z)=P(jz)=1+jz^{-1}P_1(-z^2)$. The conversion from $v_c(n)$ to $r_c(n)$ may thus be performed as illustrated in FIG. 7(a).

In the wideband case discussed above, there is an additional decimation to generate $r_w(n)$ from $r_c(n)$. In particular, in the case of decimation by two, $r_w(m)$ may be obtained via the downsampling-by-two operation seen in FIG. 3(c). The downsampler discards every second sample of $r_c(n)$, which implies $r_w(m)=r_c(2m)$. Using the fact that multiplication by $(-j)^m$ at the input of the downsampler corresponds to multiplication by $(-1)^m$ at the output, together with multirate theory, the Hilbert filtering and downsampling may be combined into the efficient scheme as shown in FIG. 7(b).

As known to the skilled person, a two-channel TI-ADC may be described as a desired signal component and an aliasing component. The size of the aliasing component may be described in terms of a real-valued filter, which may be determined directly or indirectly using estimation procedures available for TI-ADCs. Here the TI-ADC mismatch estimate may be used. As also known to the skilled person, the I/Q channel mismatch may be described as a desired signal component and a mirror-image component. The size of the mirror-image component may be described in terms of a complex-valued filter. Given the aliasing component filter of the TI-ADC, the corresponding complex I/Q channel mismatch filter may then be obtained by frequency shifting an analytic representation of the aliasing component filter. If the aliasing component real valued filter is $F(e^{j\omega T})$ in the frequency domain with impulse response $f(n)$ in the time domain, and the complex valued filter is $G(e^{j\omega T})$ in the frequency domain with impulse response $g(n)$ in the time-domain, the following relation may be derived:

$f(n)=j^n g(n)+(-j)^n g^*(n)$, where $g^*$ is the conjugate of $g(n)$, and with frequency response satisfying:

$F(e^{j\omega T})=G(e^{j(\omega T-\pi/2)})$, $\omega T\in[\pi/2-\omega_c T, \pi/2+\omega_c T]$. As realized, $f(n)$ and $F(e^{j\omega T})$ may be obtained directly or indirectly from the obtained TI-ADC mismatch estimate. The relation between the filters may be utilized by the skilled person to e.g. to arrive at an estimate of the I/Q channel mismatch based on the obtained TI-ADC mismatch as mentioned above under Action 104 and/or in a situation corresponding to the second alternative of embodiments mentioned above under Action 105, i.e. where estimation is made in the "TI-ADC problem domain" and the TI-ADC mismatch estimate is obtained, but the compensation is made in the "I/Q problem domain" based on the obtained TI-ADC mismatch estimate. For example, $F(e^{j\omega T})$ may be expressed according to a first expression $$F(e^{j\omega T}) = \frac{1-Q(j\omega - j\pi/T)}{1+Q(j\omega - j\pi/T)}$$

for $\omega T \epsilon [-\omega_c T + \pi/2, \omega_c T + \pi/2]$, where $Q(j\omega)$ is the ratio between the TI-ADC channel frequency responses, and $G(e^{j\omega T})$ may be expressed according to a second expression $$G(e^{j\omega T}) = \frac{1 - Q(j\omega - j\pi/2T)}{1 + Q(j\omega - j\pi/2T)}$$

for $\omega T \epsilon [-\omega_c T, \omega_c T]$. In practice, g(n) may then be determined so that its frequency response $G(e^{j\omega T})$ approximates the right-hand side of the second expression. Alternatively, one may first determine f(n) so that it frequency response $F(e^{j\omega T})$ approximates the right-hand side of the first expression and then obtain g(n) from f(n). However, the latter alternative may require a Hilbert transformer to get the analytic representation of f(n), which subsequently is modulated to generate g(n). Consequently, the first mentioned alternative may be preferred.

As already mentioned, what has been discussed above may as well be used in the "opposite direction". Hence, embodiments herein relating to a method for method for handling a frequency dependent mismatch of a two-channel time-interleaved analog-to-digital converter, "TI-ADC", will now be elaborated and described with reference to the flowchart depicted in FIG. 8. The method comprises the following actions, which actions may be taken in any suitable order. Further, actions may be combined. For facilitating comparison and understanding in relation to the above, the same denominations have been used for signals that mathematically correspond to each other, e.g. r(n) and v(n). However, as realized by the skilled person, in a practical situation the signals represent different quantities determined by the origin of the respective signal. For example, it is realized that r(n) and v(n) above relate to the I/Q downconverted signal, while r(n) and v(n) below, relate to an output signal from the two-channel TI-ADC.

Action 801

A discrete-time signal v(n) based on an analog-to-digital conversion performed by the two-channel TI-ADC on a continuous-time signal is obtained. The discrete-time signal v(n) is bandlimited to a bandpass region. The bandpass region may correspond to $\omega T \epsilon [-\pi/2 - \omega_c T, -\pi/2 + \omega_c T] \cup [+\pi/2 - \omega_c T, +\pi/2 + \omega_c T]$, where $\omega_c$ is the angular cut-off frequency and T corresponds to the sample period of the two-channel TI-ADC. Thus, the discrete-time signal v(n) may be obtained so that the bandpass region for respective positive and negative frequency parts is centered around $+\pi/2$ and $-\pi/2$.

Hence, if it is desired to A/D convert also a low-frequency region including DC, using I/Q balancing related procedures to compensate for TI-ADC mismatch is typically not applicable.

Action 802

An intermediate signal r(n) that corresponds to $(-j)^n$ multiplied by an analytic representation of the obtained discrete-time signal v(n) is formed. This corresponds to, similarly as discussed above, a conversion from a "TI-ADC signal" problem to an I/Q signal" problem. As should be recognized, similarly as for the opposite direction, forming of such intermediate signal r(n) may be practically implemented in several different ways available to the skilled person.

Action 803

A procedure for obtaining an estimate of an in-phase and quadrature, "I/Q", channel mismatch of an I/Q down-converted signal, is applied on the formed intermediate signal r(n). Thereby an I/Q channel mismatch estimate is obtained.

As recognized by the skilled person, there are a number of procedures for obtaining an estimate of a channel mismatch of an I/Q down-converted signal that may be used in the present action, for example any of the procedures referred to in the Background and that relates to estimating. By the forming of the intermediate signal r(n) according to the previous action, procedures developed for obtaining an estimate of a channel mismatch of an I/Q down-converted signal become usable in the present context, i.e. in the context of handling a frequency dependent mismatch of a two-channel TI-ADC.

For facilitating understanding, one way of looking upon the above described Actions 801-803, is that v(n) may be considered obtained in a "TI-ADC problem domain", then v(n) is converted to r(n) and thereby transferred to an "I/Q problem domain", which enable use of existing and upcoming procedures in the "I/Q problem domain" for solving mismatch problems actually relating to the "TI-ADC problem domain", Action 804

This is an optional action, where the frequency dependent mismatch of the two-channel TI-ADC is estimated based on the obtained I/Q channel mismatch estimate from action 803. The obtained I/Q channel mismatch estimate comprises information that may be converted to an estimate of the frequency dependent mismatch of the two-channel TI-ADC, or the information may be extracted and/or used in some other way depending on application and/or choice of implementation available to the skilled person. Note that in some embodiments, see e,g, Action 805 below, the frequency dependent mismatch of the two-channel TI-ADC may be compensated based on the obtained I/Q channel mismatch estimate without explicitly estimating the frequency dependent mismatch of the two-channel TI-ADC.

It may be considered implicit that estimation of the frequency dependent mismatch of the two-channel TI-ADC results in that an estimate of the frequency dependent mismatch of the two-channel TI-ADC is obtained, which estimate is suitable to use for compensating the frequency dependent mismatch of the two-channel TI-ADC. For example, as discussed above, the estimate may be considered to directly or indirectly relate to filter coefficients that may be used for compensation of the frequency dependent mismatch of the two-channel TI-ADC. In case of embodiments herein that comprise no compensation, the estimation would thus typically be followed by providing the obtained estimate for further use, so it may be used in compensation of the frequency dependent mismatch of the two-channel TI-ADC, e.g. by providing it to a circuit or device for compensating the frequency dependent mismatch of the two-channel TI-ADC.

Action 805

This is an optional action, where the frequency dependent mismatch of the two-channel TI-ADC is compensated based on the obtained I/Q channel mismatch estimate from action 803.

In some embodiments of a first alternative, the frequency dependent mismatch of the two-channel TI-ADC may be compensated by applying, on the intermediate signal r(n) and based on the obtained I/Q channel mismatch estimate, a procedure for compensating an I/Q channel mismatch of an I/Q down-converted signal. This procedure may be a procedure that is associated with, and typically disclosed together with, the procedure for obtaining the estimate in Action 803, i.e. for obtaining the estimate of the I/Q channel mismatch. Thereby a compensated version $r_c(n)$ of the intermediate signal $r(n)$ is obtained. A compensated version $v_c(n)$ of the discrete-time signal $v(n)$ may be formed, which compensated version $v_c(n)$ corresponds to $2\text{Re}\{r_c(n)j^n\}$, where Re refers to the real part. The conversion may be viewed upon as a matter of performing a reversed conversion of the conversion discussed for Action 802. The embodiments of the first alternative may be viewed upon as the actual compensating of the frequency dependent mismatch of the two-channel TI-ADC is made in the above-mentioned "I/Q problem domain", resulting in a compensated signal $r_c(n)$ that comprises information corresponding to, and that may be converted to, the compensated version $v_c(n)$ of $v(n)$ in the original "TI-ADC problem domain". Similarly as mentioned above for Action 804, the information may be extracted and/or used in some other way depending on application and/or choice of implementation available to the skilled person.

In some embodiments of a second alternative, the frequency dependent mismatch of the two-channel TI-ADC is compensated by first estimating, based on the obtained I/Q channel mismatch estimate, the frequency dependent mismatch of the two-channel TI-ADC. Then the frequency dependent mismatch of the two-channel TI-ADC is compensated by applying, on the discrete-time signal $v(n)$ and based on the estimated frequency dependent mismatch of the two-channel TI-ADC, a procedure for compensating a frequency dependent mismatch of a two-channel TI-ADC. Thereby a compensated version $v_c(n)$ of the discrete-time signal $v(n)$ is obtained. That is, these embodiments may be viewed upon as the estimating of the frequency dependent mismatch of the two-channel TI-ADC is made in the "I/Q problem domain" through the obtained estimate. Thereafter the actual compensating of the discrete-time signal $v(n)$ may be carried out in the "TI-ADC problem domain" and may use any conventional procedure for compensating frequency dependent mismatch of the two-channel TI-ADC based on a first estimated frequency dependent mismatch of the two-channel TI-ADC.

Similarly as above, reasons for implementing embodiments of the second alternative instead of the first alternative include if a practical situation results in that the compensation in the "I/Q problem domain" would become more complex than compensation in the "TI-ADC problem domain". However, in some other practical situations, the opposite may be true. Hence, in a practical situation, a complexity investigation may first be carried out and then determine if embodiments of the first or second alternative is best to implement.

Figure 9:
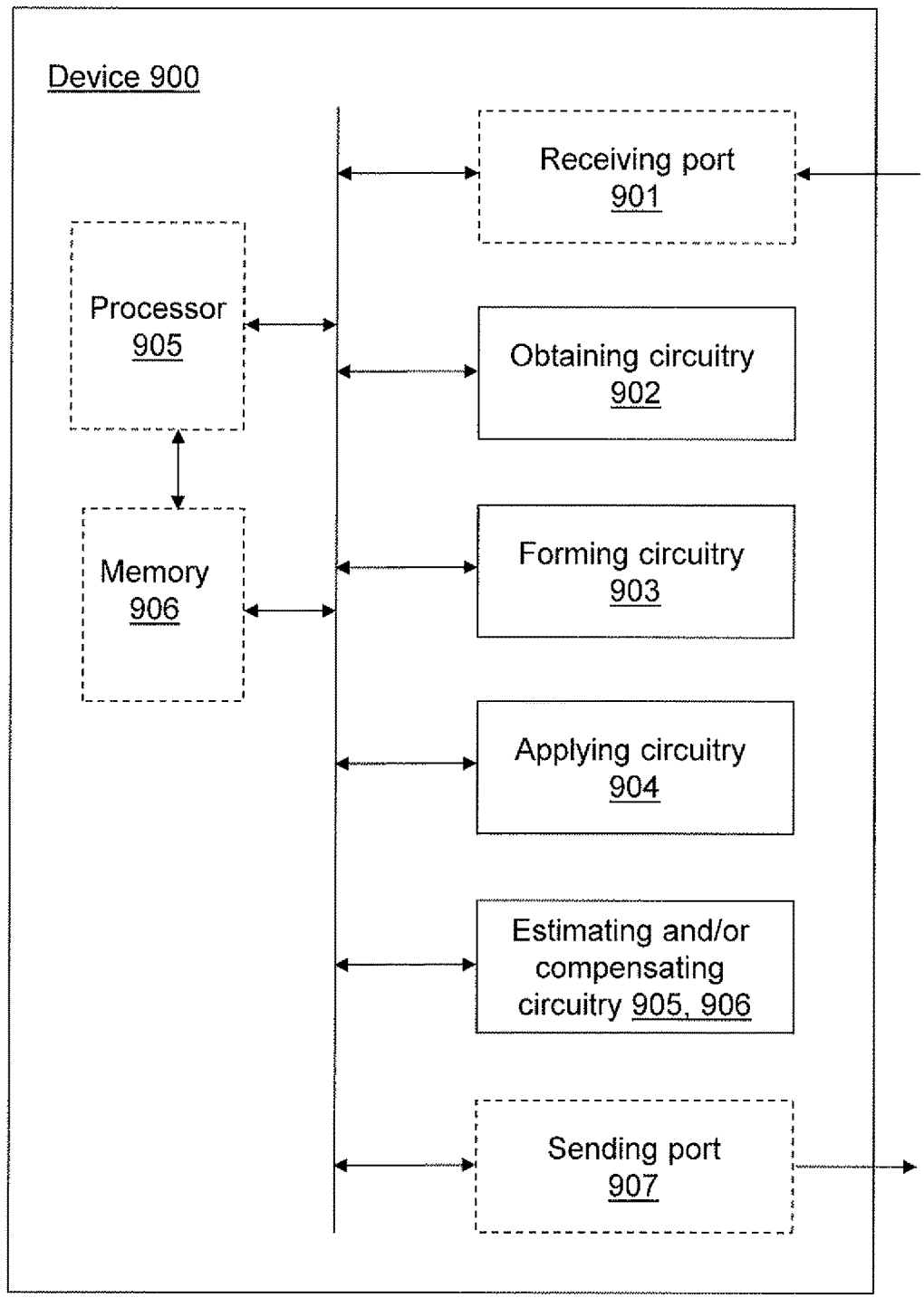
FIG. 9 is a schematic block diagram illustrating a device for handling a frequency dependent mismatch of a two-channel TI-ADC, according to embodiments herein.

To perform the actions 801-805 above for handling a frequency dependent mismatch of the two-channel TI-ADC, a device 900 may be provided that comprises an arrangement schematically depicted in FIG. 9.

In some embodiments, the device 900 comprises a receiving port 910 that may be configured to receive said discrete-time signal $v(n)$ from an external device or circuitry.

The device 200 comprises an obtaining circuitry 902, configured to obtain said discrete-time signal $v(n)$ based on the analog-to-digital conversion performed by the two-channel TI-ADC on a continuous-time signal, wherein the discrete-time signal $v(n)$ is bandlimited to said bandpass region.

The obtaining circuitry 902 may be configured to obtain $v(n)$ by receiving it, directly or via the receiving port 910, from another device or circuitry. Such another circuitry may be integrated with the device 900.

The device 900 further comprises a forming circuitry 903, configured to form said intermediate signal $r(n)$ that corresponds to $(-j)^n$ multiplied by said analytic representation of the obtained discrete-time signal $v(n)$.

Moreover, the device 900 comprises an applying circuitry 904, configured to apply, on the formed intermediate signal $r(n)$, said procedure for obtaining an estimate of an I/Q channel mismatch of an I/Q down-converted signal, to thereby obtain the I/Q channel mismatch estimate.

The device 900 also comprises an estimating circuitry 905 and/or compensating circuitry 906, configured to respectively estimate and/or compensate the frequency dependent mismatch of the two-channel TI-ADC based on the obtained I/Q channel mismatch estimate. Note that the estimating circuitry 905 and/or compensating circuitry 906 is shown as one entity to simplify presentation, but that it shall be understood that what is shown is meant to include also the situation with either one of the estimating circuitry 905 and the compensating circuitry 906, or both circuitries but separated.

In some embodiments, corresponding to said embodiments of a first alternative as mentioned above under Action 805, the compensating circuitry 906 is configured to compensate the frequency dependent mismatch of the two-channel TI-ADC by applying, on the intermediate signal $r(n)$ and based on the obtained I/Q channel mismatch estimate, said procedure for compensating an I/Q channel mismatch of an I/Q down-converted signal, to thereby obtain the compensated version $r_c(n)$ of the intermediate signal $r(n)$. Moreover, the compensating circuitry 906 may be further configured to form the compensated version $v_c(n)$ of the discrete-time signal $v(n)$.

In some embodiments, corresponding to said embodiments of a second alternative as mentioned above under Action 805, the estimating circuitry 905 and the compensating circuitry 906 are configured to compensate the frequency dependent mismatch of the two-channel TI-ADC by first estimating, based on the obtained I/Q channel mismatch estimate, the frequency dependent mismatch of the two-channel TI-ADC and then compensating the frequency dependent mismatch of the two-channel TI-ADC by applying, on the discrete-time signal $v(n)$ and based on the estimated frequency dependent mismatch of the two-channel TI-ADC, said procedure for compensating a frequency dependent mismatch of a two-channel TI-ADC, to thereby obtain the compensated version $v_c(n)$ of the discrete-time signal $v(n)$.

In some embodiments the device 200 comprises a sending port 907 that may be configured to send information resulting from the estimating circuitry 905, e.g. an obtained estimate, and/or from the compensating circuitry 906, e.g. a compensated signal, to an external device or circuitry.

In some embodiments, the estimating circuitry 905 may be configured to, directly or via, the sending port 907, send the estimated frequency dependent mismatch of the two-channel TI-ADC, or information comprised therein, to another device or circuitry for further handling, e.g. another device or circuitry for compensation of the mismatch. In some embodiments such another circuitry may be integrated with the device 900. In some embodiments, the compensating circuitry 906 may be configured to, directly or via the sending port 907, send information relating to the compensated frequency dependent mismatch of the two-channel TI-ADC, typically in the form of the compensated version $v_c(n)$ of the discrete-time signal $v(n)$, to another device or circuitry for further handling, e.g. for use of the compensated version $v_c(n)$ of the discrete-time signal v(n). Also here such another circuitry may be integrated with the device 900.

The embodiments of the device 900 may be implemented through one or more processors, such as a processor 905 in the device 900 depicted in FIG. 9, together with computer program code for performing the functions and actions of embodiments herein. In some embodiments the circuitry discussed above may be fully or partially implemented by the processor 905.

The computer program code mentioned above may also be provided as a computer program product, for instance in the form of a data carrier carrying computer program code for performing the embodiments herein when being loaded into and executed on the device 900. One such carrier may be in the form of a CD or DVD. It is however feasible with other data carriers such as a memory stick, memory card or hard drive. The computer program code may furthermore be provided as pure program code on a server for download to the device 900. The computer program code may furthermore be provided in the form of a data file or files on, or available through, a server for download. The file or files may be executable files for direct or indirect download to and execution on the device 900, or may be for intermediate download and compilation to make them executable before download to and for execution in the device 900. The server may be accessible over a computer network, such as the Internet, and may e.g. be a web or ftp server.

The device 900 may further comprise a memory 906 comprising one or more memory units. The memory 906 is arranged to store data, such as values comprised in v(n), r(n), $r_c(n)$, $v_c(n)$ and/or results from the estimating, and configurations and/or software code to perform the method when being executed in the device 900.

Those skilled in the art will also appreciate that the circuitry and ports 901-907 may refer to a combination of analog and digital circuits, and/or one or more processors, such as the processor 905, configured with software and/or firmware (e.g., stored in memory) that, when executed by the one or more processors, perform as described above. One or more of these processors, as well as the other digital hardware, may be included in an application-specific integrated circuit (ASIC), a Field Programmable Gate Array (FPGA), and/or several processors and various digital hardware may be distributed among several separate components, whether individually packaged or assembled into a system-on-a-chip (SoC).

It is evidently so that device 900 described above may be used for estimating and/or compensating the frequency dependent mismatch of the two-channel TI-ADC.

Figure 8:
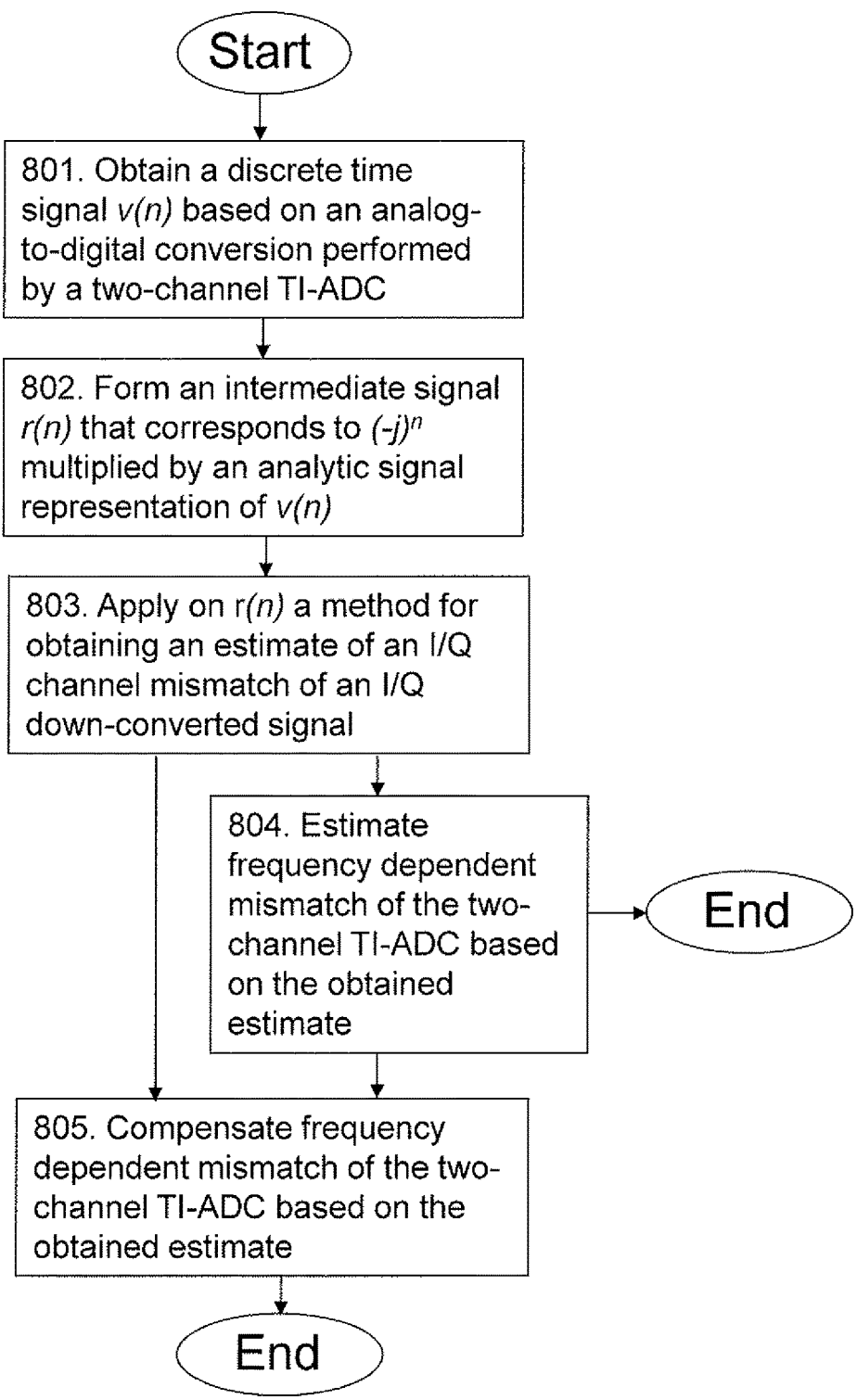
FIG. 8 is a flow chart illustrating a method for handling a frequency dependent mismatch of a two-channel time-interleaved analog-to-digital converter (TI-ADC), according to embodiments herein.
Figure 10:
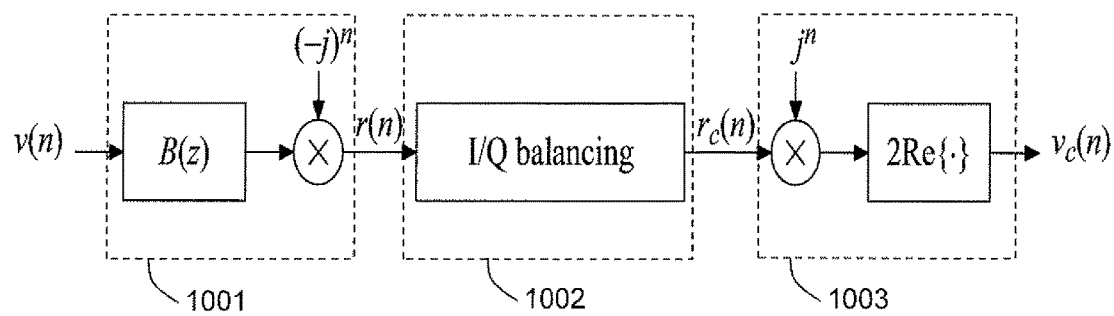
FIG. 10 is a schematic block diagram illustrating a situation where embodiments herein are utilized to compensate a frequency dependent mismatch of a two-channel TI-ADC.

As already mentioned, the embodiments herein described above in connection with FIGS. 8-9 are based on utilizing the basic concept underlying all embodiments herein but in the "opposite direction" compared to the embodiments herein described in connection with FIGS. 1-7. However, since the basic concept is the same, it is understood that what has been described in connection with FIGS. 1-7, in particular FIGS. 3-7, after appropriate adjustments recognizable by the skilled person, are relevant also of the embodiments herein described in connection with FIGS. 8-9. See for example FIG. 10 illustrating a situation where embodiments herein are utilized to compensate a frequency dependent mismatch of a two-channel TI-ADC, which may be compared to FIG. 3(a) in the foregoing. It is easily recognized that the compensation of the frequency dependent mismatch of a two-channel TI-ADC in FIG. 10 may be viewed upon as a reversed, or opposite direction, version of the compensation of the I/Q channel mismatch in FIG. 3(a). In FIG. 10, the signals r(n), v(n) described in connection with FIGS. 8-9 are easily identified. It is realized that block 1001 corresponds to Action 802 and block 1002 to Actions 803-805. The signals $v_c(n)$ and $r_c(n)$ are respective compensated versions of v(n) and r(n). Since compensation is made on v(n), thus in the "I/Q problem domain", it is realized that the situation corresponds to the first alternative of embodiments discussed above under Action 805. As mentioned above, in principle any procedure available for I/Q channel mismatch compensation, also referred to by I/Q balancing, may be used for implementation of block 1002. In block 1003 a conversion from $r_c(n)$ to $v_c(n)$ is performed, which may be viewed upon as a conversion "back" from the "I/Q problem domain" to the "TI-ADC problem domain". It is realized that all information about the compensated signal is in $r_c(n)$ and that in some embodiments this information may be utilized without any actual converting back to the "TI-ADC problem domain".

Generally, embodiments herein are not limited to the above described features and details. Various alternatives, modifications and equivalents may be used. Therefore, the above embodiments should not be taken as limiting the scope of the invention, which is defined by the appending claims.

When using the word "comprise" or "comprising" it shall be interpreted as non-limiting, i.e. meaning "consist at least of".

The invention claimed is:

1. A method for handling an in-phase and quadrature ("I/Q") channel mismatch of an I/Q down-converted signal, wherein the method comprises:
    obtaining a discrete-time complex valued signal r(n) that is based on an analog-to-digital conversion of the I/Q down-converted signal, wherein the obtained discrete-time complex valued signal r(n) is oversampled by a factor of two or more;
    forming an intermediate signal v(n) that corresponds to the real part of a π/2 frequency shifted version of the obtained discrete-time complex valued signal r(n);
    applying, on the formed intermediate signal v(n), a procedure for obtaining an estimate of a frequency dependent mismatch of a two-channel time-interleaved analog-to-digital converter ("TI-ADC") thereby obtaining a TI-ADC mismatch estimate; and
    estimating and/or compensating the I/Q channel mismatch based on the obtained TI-ADC mismatch estimate.

2. The method as claimed in claim 1, wherein the intermediate signal v(n) corresponds to $2\text{Re}\{r(n)j^n\}$, where Re indicates the real part and j is the imaginary unit.

3. The method as claimed in claim 1, wherein the I/Q channel mismatch is being compensated by applying, on the intermediate signal v(n) and based on the obtained TI-ADC mismatch estimate, a procedure for compensating a frequency dependent mismatch of a two-channel TI-ADC, thereby obtaining a compensated version $v_c(n)$ of the intermediate signal v(n).

4. The method as claimed in claim 3, wherein a compensated version $r_c(n)$ of the discrete-time complex valued signal r(n) is formed, which compensated version $r_c(n)$ corresponds to a π/2 frequency shift of an analytic representation of said compensated version $v_c(n)$, which π/2 frequency shift is in the opposite direction compared to said π/2 frequency shifted version of the obtained discrete-time complex valued signal r(n).

5. The method as claimed in claim 1, wherein the I/Q channel mismatch is being compensated by first estimating, based on the obtained TI-ADC mismatch estimate, the I/Q channel mismatch and then compensating the I/Q channel mismatch by applying, on the discrete-time complex valued signal r(n) and based on the estimated I/Q channel mismatch, a procedure for compensating an I/Q channel mismatch of an I/Q down-converted signal, thereby obtaining a compensated version $r_c(n)$ of the discrete-time complex valued signal r(n).

6. The method as claimed in claim 1, wherein the forming of the intermediate signal v(n) comprises alternatingly taking every second sample from respective real and imaginary parts of the obtained discrete-time complex valued signal r(n).

7. The method as claimed in claim 1, wherein the obtaining of the discrete-time complex valued signal r(n) comprises:
obtaining a wideband discrete-time complex valued signal $r_w(m)$ based on the analog-to-digital conversion of the I/Q down-converted signal, wherein wideband indicates that $r_w(m)$ has an angular cut-off frequency such that $\omega_c T \geq \pi/2$, where $\omega_c$ is the angular cut-off frequency and T corresponds to the sample period used in the analog-to-digital conversion; and
interpolating the wideband discrete-time complex valued signal $r_w(m)$ to obtain the discrete-time complex valued signal r(n) that is oversampled by a factor of two or more.

8. The method as claimed in claim 7, wherein the interpolating is made by a factor of two or more.

9. The method as claimed in claim 8, wherein the interpolating is being performed by means of a half-band filter.

10. A device for handling an in-phase and quadrature ("I/Q") channel mismatch of an I/Q down-converted signal, wherein the device comprises:
an obtaining circuitry, configured to obtain a discrete-time complex valued signal r(n) that is based on an analog-to-digital conversion of the I/Q down-converted signal, wherein the obtained discrete-time complex valued signal r(n) is oversampled by a factor of two or more,
a forming circuitry, configured to form an intermediate signal v(n) from the discrete-time complex valued signal r(n), which intermediate signal v(n) corresponds to the real part of a π/2 frequency shifted version of the obtained discrete-time complex valued signal r(n),
an applying circuitry, configured to apply, on the formed intermediate signal v(n), a procedure for obtaining an estimate of a frequency dependent mismatch of a two-channel time-interleaved analog-to-digital converter ("TI-ADC") to thereby obtain a TI-ADC mismatch estimate, and
an estimating circuitry and/or compensating circuitry, configured to respectively estimate and/or compensate the I/Q channel mismatch based on the obtained TI-ADC mismatch estimate.

11. The device as claimed in claim 10, wherein the intermediate signal v(n) corresponds to $2\text{Re}\{r(n)j^n\}$, where Re indicates the real part and j is the imaginary unit.

12. The device as claimed in claim 10, wherein the compensating circuitry is configured to compensate the I/Q channel mismatch by applying, on the intermediate signal v(n) and based on the obtained TI-ADC mismatch estimate, a procedure for compensating a frequency dependent mismatch of a two-channel TI-ADC, to thereby obtain a compensated version $v_c(n)$ of the intermediate signal v(n).

13. The device as claimed in claim 12, wherein the compensating circuitry is further configured to form a compensated version $r_c(n)$ of the discrete-time complex valued signal r(n), which compensated version $r_c(n)$ corresponds to a π/2 frequency shift of an analytic representation of said compensated version $v_c(n)$, which π/2 frequency shift is in the opposite direction compared to said π/2 frequency shifted version of the obtained discrete-time complex valued signal r(n).

14. The device as claimed in claim 10, wherein the estimating circuitry and compensating circuitry are configured to compensate the I/Q channel mismatch by first estimating, based on the obtained TI-ADC mismatch estimate, the I/Q channel mismatch and then compensating the I/Q channel mismatch by applying, on the discrete-time complex valued signal r(n) and based on the estimated I/Q channel mismatch, a procedure for compensating an I/Q channel mismatch of an I/Q down-converted signal, to thereby obtain a compensated version $r_c(n)$ of the discrete-time complex valued signal r(n).

15. The device as claimed in claim 10, wherein the forming circuitry is configured to alternatingly taking every second sample from respective real and imaginary parts of the obtained discrete-time complex valued signal r(n).

16. The device as claimed in claim 10, wherein the obtaining circuitry is configured to obtain a wideband discrete-time complex valued signal $r_w(m)$ based on the analog-to-digital conversion of the I/Q down-converted signal, wherein wideband indicates that $r_w(m)$ has an angular cut-off frequency such that $\omega_c T \geq \pi/2$, where $\omega_c$ is the angular cut-off frequency and T corresponds to the sample period used in the analog-to-digital conversion, and the obtaining circuitry is configured to interpolate the wideband discrete-time complex valued signal $r_w(m)$ to obtain the discrete-time complex valued signal r(n) that is oversampled by a factor of two or more.

17. The device as claimed in claim 16, wherein the obtaining circuitry is configured to interpolate the wideband discrete-time complex valued signal $r_w(m)$ by a factor of two or more.

18. The device as claimed in claim 17, wherein the obtaining circuitry is configured to perform the interpolation by means of a half-band filter.

19. A method for handling a frequency dependent mismatch of a two-channel time-interleaved analog-to-digital converter ("TI-ADC") wherein the method comprises:
obtaining a discrete-time signal v(n) based on an analog-to-digital conversion performed by the two-channel TI-ADC on a continuous-time signal, wherein the discrete-time signal v(n) is bandlimited to a bandpass region,
forming an intermediate signal r(n) that corresponds to $(-j)^n$ multiplied by an analytic representation of the obtained discrete-time signal v(n), where j is the imaginary unit,
applying, on the formed intermediate signal r(n), a procedure for obtaining an estimate of an in-phase and quadrature ("I/Q") channel mismatch of an I/Q down-converted signal, thereby obtaining an I/Q channel mismatch estimate, and
estimating and/or compensating the frequency dependent mismatch of the two-channel TI-ADC based on the obtained I/Q channel mismatch estimate.

20. The method as claimed in claim 19, wherein the frequency dependent mismatch of the two-channel TI-ADC is being compensated by applying, on the intermediate signal r(n) and based on the obtained I/Q channel mismatch estimate, a procedure for compensating an I/Q channel mismatch of an I/Q down-converted signal, thereby obtaining a compensated version $r_c(n)$ of the intermediate signal $r(n)$.

21. The method as claimed in claim 20, wherein a compensated version $v_c(n)$ of the discrete-time signal $v(n)$ is formed, which compensated version $v_c(n)$ corresponds to $2\text{Re}\{r_c(n)j^n\}$, where Re refers to the real part and j is the imaginary unit.

22. The method as claimed in claim 19, wherein the frequency dependent mismatch of the two-channel TI-ADC is being compensated by first estimating, based on the obtained I/Q channel mismatch estimate, the frequency dependent mismatch of the two-channel TI-ADC and then compensating the frequency dependent mismatch of the two-channel TI-ADC by applying, on the discrete-time signal $v(n)$ and based on the estimated frequency dependent mismatch of the two-channel TI-ADC, a procedure for compensating a frequency dependent mismatch of a two-channel TI-ADC, thereby obtaining a compensated version $v_c(n)$ of the discrete-time signal $v(n)$.

23. A device for handling a frequency dependent mismatch of a two-channel time-interleaved analog-to-digital converter ("TI-ADC") wherein the device comprises:
an obtaining circuitry, configured to obtain a discrete-time signal $v(n)$ based on an analog-to-digital conversion performed by the two-channel TI-ADC on a continuous-time signal, wherein the discrete-time signal $v(n)$ is bandlimited to a bandpass region;
a forming circuitry, configured to form an intermediate signal $r(n)$ that corresponds to $(-j)^n$ multiplied by an analytic representation of the obtained discrete-time signal $v(n)$, where j is the imaginary unit;
an applying circuitry, configured to apply, on the formed intermediate signal $r(n)$, a procedure for obtaining an estimate of an in-phase and quadrature, "I/Q", channel mismatch of an I/Q down-converted signal, to thereby obtain an I/Q channel mismatch estimate; and
an estimating circuitry and/or compensating circuitry, configured to respectively estimate and/or compensate the frequency dependent mismatch of the two-channel TI-ADC based on the obtained I/Q channel mismatch estimate.

24. The device as claimed in claim 23, wherein the compensating circuitry, is configured to compensate the frequency dependent mismatch of the two-channel TI-ADC by applying, on the intermediate signal $r(n)$ and based on the obtained I/Q channel mismatch estimate, a procedure for compensating an I/Q channel mismatch of an I/Q down-converted signal, to thereby obtain a compensated version $r_c(n)$ of the intermediate signal $r(n)$.

25. The device as claimed in claim 24, wherein the compensating circuitry, is further configured to form a compensated version $v_c(n)$ of the discrete-time signal $v(n)$, which compensated version $v_c(n)$ corresponds to $2\text{Re}\{r_c(n)j^n\}$, where Re refers to the real part and j is the imaginary unit.

26. The device as claimed in claim 23, wherein the estimating circuitry and compensating circuitry are configured to compensate the frequency dependent mismatch of the two-channel TI-ADC by first estimating, based on the obtained I/Q channel mismatch estimate, the frequency dependent mismatch of the two-channel TI-ADC and then compensating the frequency dependent mismatch of the two-channel TI-ADC by applying, on the discrete-time signal $v(n)$ and based on the estimated frequency dependent mismatch of the two-channel TI-ADC, a procedure for compensating a frequency dependent mismatch of a two-channel TI-ADC, to thereby obtain a compensated version $v_c(n)$ of the discrete-time signal $v(n)$.

\* \* \* \* \*